US012701852B2

(12) United States Patent
Eom et al.

(10) Patent No.: US 12,701,852 B2
(45) Date of Patent: Aug. 4, 2026

(54) DISPLAY DEVICE AND TILED DISPLAY DEVICE

(71) Applicant: Samsung Display Co., LTD., Yongin-si (KR)

(72) Inventors: Tae Jong Eom, Yongin-si (KR); Hui Won Yang, Yongin-si (KR); Jae Phil Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 763 days.

(21) Appl. No.: 18/158,394

(22) Filed: Jan. 23, 2023

(65) Prior Publication Data

US 2023/0238499 A1 Jul. 27, 2023

(30) Foreign Application Priority Data

Jan. 27, 2022 (KR) ........................ 10-2022-0012576
Oct. 21, 2022 (KR) ........................ 10-2022-0136144

(51) Int. Cl.

| | |
|---|---|
| *H10H 29/49* | (2025.01) |
| *G09F 9/302* | (2006.01) |
| *G09F 9/33* | (2006.01) |
| *H10H 20/831* | (2025.01) |
| *H10H 20/857* | (2025.01) |
| *H10H 29/14* | (2025.01) |
| *H10H 29/39* | (2025.01) |
| *H10H 29/80* | (2025.01) |
| *H10W 90/00* | (2026.01) |

(52) U.S. Cl.
CPC ........... *H10H 29/49* (2025.01); *G09F 9/3026* (2013.01); *G09F 9/33* (2013.01); *H10H 20/831* (2025.01); *H10H 20/857* (2025.01);

*H10H 29/142* (2025.01); *H10H 29/39* (2025.01); *H10H 29/832* (2025.01); *H10W 90/00* (2026.01)

(58) Field of Classification Search
None
See application file for complete search history.

(56) References Cited

U.S. PATENT DOCUMENTS

| | | | |
|---|---|---|---|
| 10,381,425 B2 | 8/2019 | Kang et al. | |
| 10,522,524 B2 | 12/2019 | Lee et al. | |
| 10,818,227 B2 | 10/2020 | Lee et al. | |
| 2018/0090639 A1* | 3/2018 | Ting .................. | H10H 20/8314 |

(Continued)

FOREIGN PATENT DOCUMENTS

| | | |
|---|---|---|
| KR | 10-2018-0065731 A | 6/2018 |
| KR | 10-2019-0003198 A | 1/2019 |

(Continued)

*Primary Examiner* — Feifei Yeung Lopez
(74) *Attorney, Agent, or Firm* — Womble Bond Dickinson (US) LLP

(57) ABSTRACT

A display device comprises a signal line on a first surface of a substrate, a light-emitting element on the signal line and comprising a first semiconductor layer, a second semiconductor layer, and an active layer between the first semiconductor layer and the second semiconductor layer, a connection line on a second surface of the substrate and electrically connected to the signal line, and conductive lines on the second surface of the substrate and separated from the connection line. The conductive lines comprise a first conductive layer and a second conductive layer covering the first conductive layer.

20 Claims, 19 Drawing Sheets

(56) References Cited

U.S. PATENT DOCUMENTS

2020/0042275 A1\* 2/2020 Yueh ........................ G06F 3/147
2021/0407343 A1  12/2021 Wu et al.
2022/0051632 A1\* 2/2022 Paek ........................ H10K 77/00
2022/0399380 A1\* 12/2022 Ito ........................... H05B 33/06

FOREIGN PATENT DOCUMENTS

KR    10-2021-0158791 A    12/2021
KR          10-2446214 B1     9/2022
WO    WO2021/107145 A1 \*  6/2021

\* cited by examiner

FIG. 2

SPX1: LD1, PC1
SPX2: LD2, PC2
SPX3: LD3, PC3

LN: LN1, LN2, LNC

LN: LN1, LN2

DISPLAY DEVICE AND TILED DISPLAY DEVICE

CROSS-REFERENCE TO RELATED APPLICATIONS

This application claims priority to Korean Patent Application No. 10-2022-0012576, filed on Jan. 27, 2022, and No. 10-2022-0136144, filed on Oct. 21, 2022, the content of which in its entirety is herein incorporated by reference.

BACKGROUND

1. Field

The disclosure relates to a display device and to a tiled display device.

2. Description of the Related Art

Recently, as interest in information display is increasing, research and development on a display device are continuously conducted.

SUMMARY

An aspect of the present disclosure provides a display device and a tiled display device capable of discharging static electricity.

Aspects of the disclosure are not limited to the aspect described above, and other aspects that are not described may be clearly understood by those skilled in the art from the following description.

According to embodiments of the disclosure, a display device includes a signal line above a first surface of a substrate, a light-emitting element above the signal line, and including a first semiconductor layer, a second semiconductor layer, and an active layer between the first semiconductor layer and the second semiconductor layer, a connection line below a second surface of the substrate, and electrically connected to the signal line, and conductive lines below the second surface of the substrate, separated from the connection line, and including a first conductive layer, and a second conductive layer covering the first conductive layer.

The conductive lines may include a first conductive line extending in a first direction, and a second conductive line extending in a second direction crossing the first direction.

The second conductive layer may directly contact the first conductive layer.

The second conductive layer may include a transparent metal material.

The light-emitting element may further include a first electrode below the first semiconductor layer, and a second electrode below the second semiconductor layer.

The light-emitting element may include a flip chip type micro light-emitting diode element.

The display device may further include a pad electrode electrically connected to the connection line.

The pad electrode may include a first pad electrode layer, and a second pad electrode layer below the first pad electrode layer.

The second conductive layer may be at a same layer as the second pad electrode layer.

The first conductive layer may be at a same layer as the connection line.

The display device may further include a side surface line on a side surface of the substrate between the first surface and the second surface of the substrate, and electrically connecting the signal line and the connection line.

According to embodiments of the disclosure, a tiled display device includes display devices, and a seam between the display devices, wherein a first display device among the display devices includes a signal line above a first surface of a substrate, a light-emitting element above the signal line, and including a first semiconductor layer, a second semiconductor layer, and an active layer between the first semiconductor layer and the second semiconductor layer, a connection line below a second surface of the substrate, and electrically connected to the signal line, and conductive lines below the second surface of the substrate, separated from the connection line, and crossing each other.

The first display device may further include a pad electrode below the second surface of the substrate, and electrically connected to the connection line.

The pad electrode may include a first pad electrode layer, and a second pad electrode layer below the first pad electrode layer.

The conductive lines may include a first conductive layer at a same layer as the first pad electrode layer.

The conductive lines may further include a second conductive layer covering the first conductive layer, and at a same layer as the second pad electrode layer.

The conductive lines may contact the pad electrode.

The first display device may further include a side surface line on a side surface of the substrate between the first surface and the second surface of the substrate, and electrically connecting the signal line and the connection line.

The light-emitting element may include a flip chip type micro light-emitting diode element.

The display devices may be arranged in a matrix form of M rows and N columns.

Details of other embodiments are included in the detailed description and drawings.

According to the above-described embodiments, because static electricity flowing into the display device may be diffused and discharged through conductive lines formed on a rear surface of the display device, damage due to the static electricity may be reduced or minimized.

An aspect according to embodiments is not limited by a content exemplified above, and more various aspects are included in the present specification.

BRIEF DESCRIPTION OF THE DRAWINGS

The above and other aspects of the disclosure will become more apparent by describing in further detail embodiments thereof with reference to the accompanying drawings, in which:

FIGS. 1 and 2 are plan views schematically illustrating a display device according to one or more embodiments;

FIG. 8 is a plan view schematically illustrating a tiled display device including a display device according to one or more embodiments;

DETAILED DESCRIPTION

Figure 1:
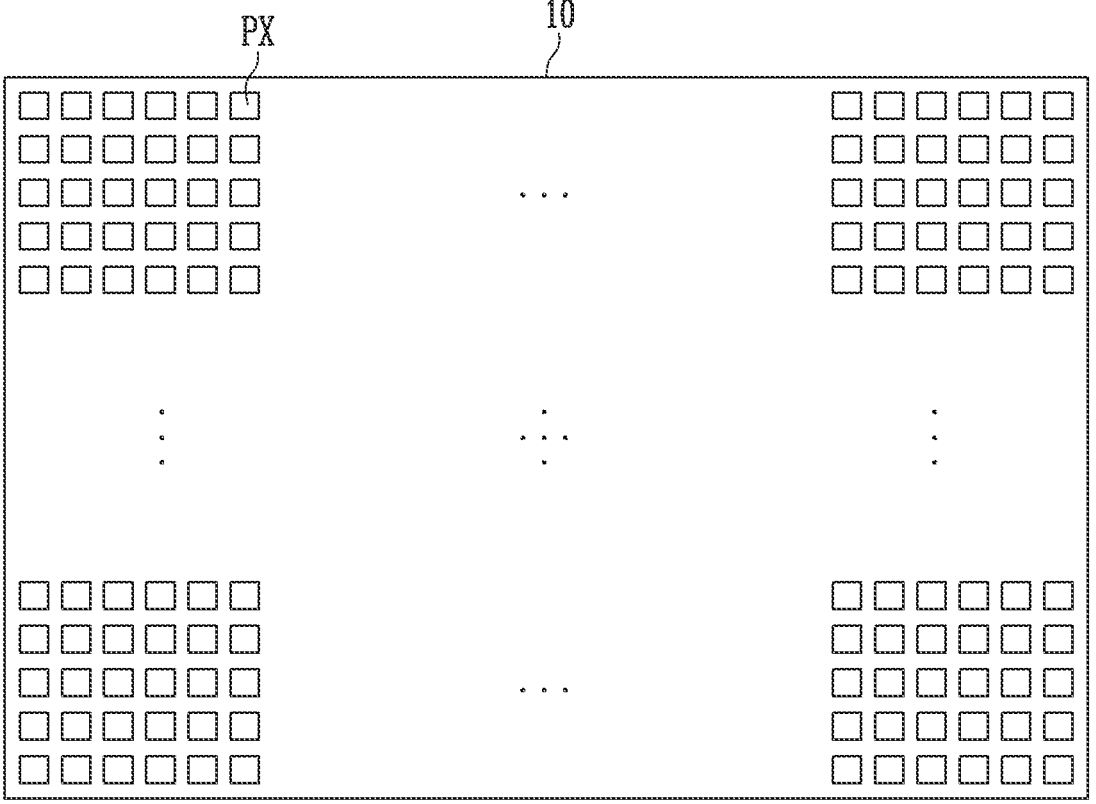
Figure 1:
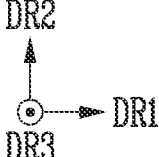

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning, such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion. Meanwhile, other expressions describing relationships between components, such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions, such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression, such as "at least one of A and B" may include A, B, or A and B. As used herein, "or" generally means "and/or," and the term "and/or" includes any and all combinations of one or more of the associated listed items. For example, the expression, such as "A and/or B" may include A, B, or A and B. Similarly, expressions, such as "at least one of," "a plurality of," "one of," and other prepositional phrases, when preceding a list of elements, modify the entire list of elements and do not modify the individual elements of the list.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Some embodiments are described in the accompanying drawings in relation to functional block, unit, and/or module. Those skilled in the art will understand that such block, unit, and/or module are/is physically implemented by a logic circuit, an individual component, a microprocessor, a hard wire circuit, a memory element, a line connection, and other electronic circuits. This may be formed using a semiconductor-based manufacturing technique or other manufacturing techniques. The block, unit, and/or module implemented by a microprocessor or other similar hardware may be programmed and controlled using software to perform various functions discussed herein, optionally may be driven by firmware and/or software. In addition, each block, unit, and/or module may be implemented by dedicated hardware, or a combination of dedicated hardware that performs some functions and a processor (for example, one or more programmed microprocessors and related circuits) that performs a function different from those of the dedicated hardware. In addition, in some embodiments, the block, unit, and/or module may be physically separated into two or more interact individual blocks, units, and/or modules without departing from the scope of the present disclosure. In addition, in some embodiments, the block, unit and/or module may be physically combined into more complex blocks, units, and/or modules without departing from the scope of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, embodiments are described with reference to the accompanying drawings.

Figure 2:
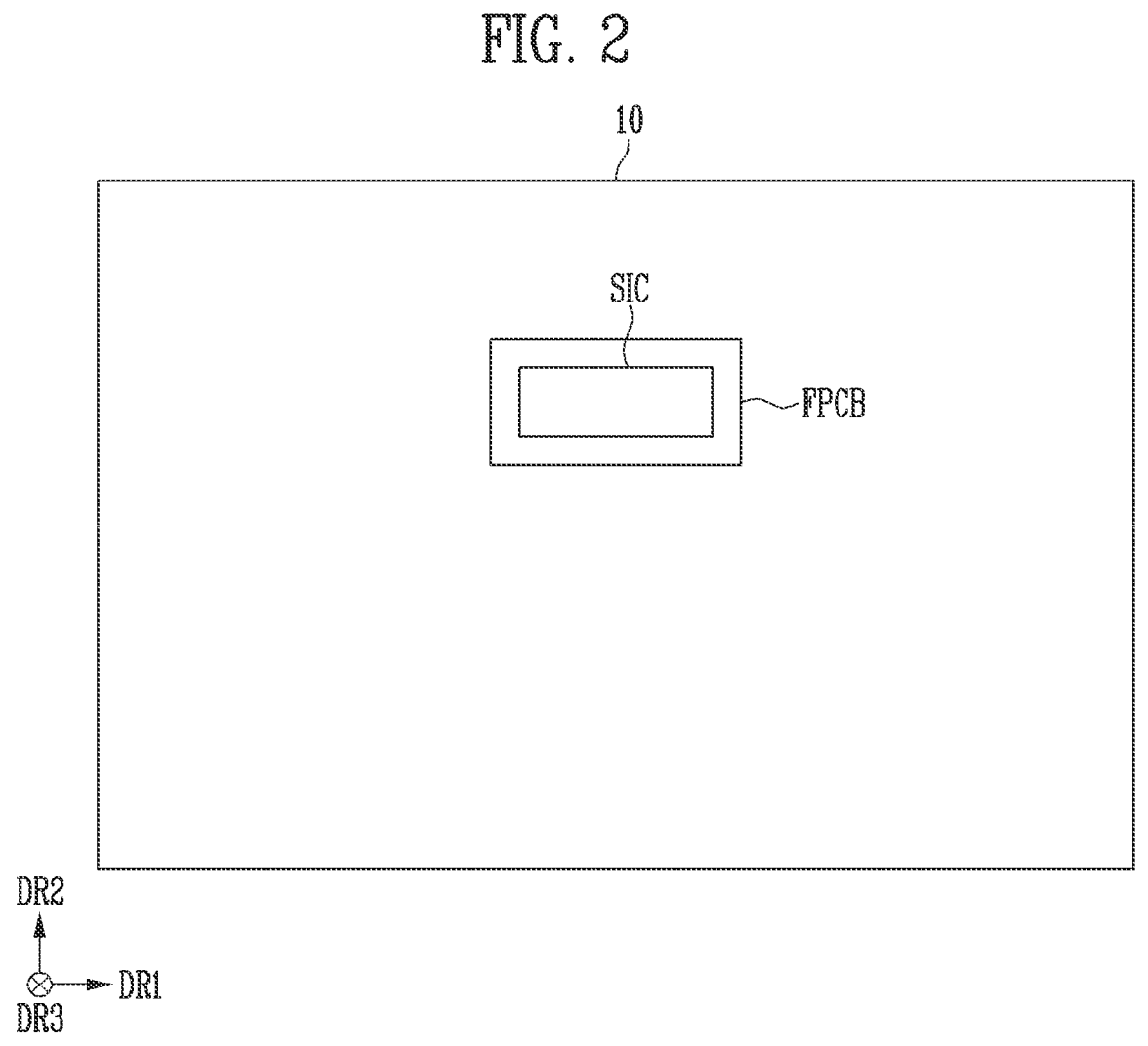
Figure 3:
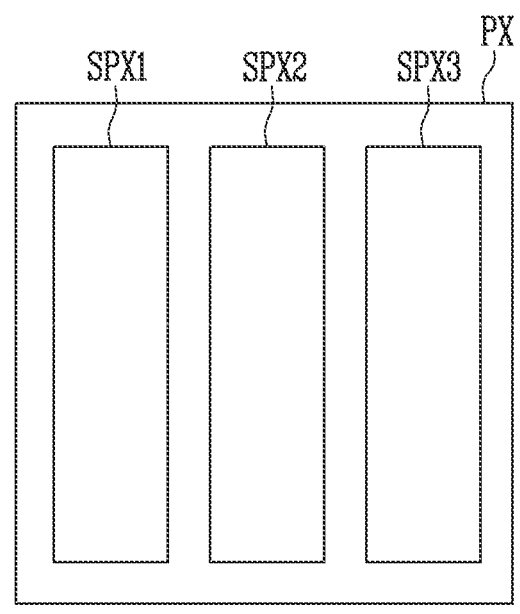
FIGS. 3 and 4 are plan views schematically illustrating a pixel of FIG. 1.
Figure 3:
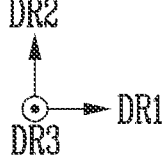
Figure 4:
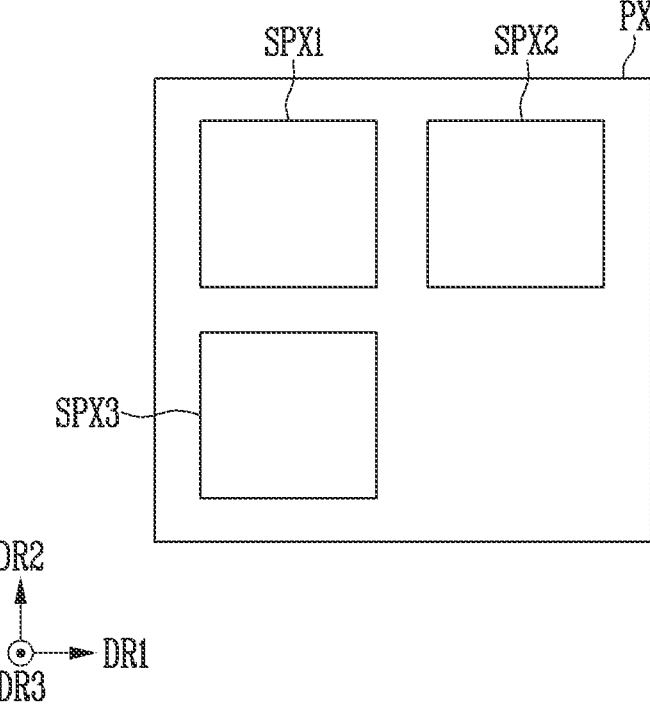

FIGS. 1 and 2 are plan views schematically illustrating a display device according to one or more embodiments. FIG. 1 shows a front surface/an upper surface of the display device 10 on which a pixel PX is positioned, and FIG. 2 shows a rear surface/a lower surface of the display device 10 on which a source driving circuit SIC is positioned. FIGS. 3 and 4 are plan views schematically illustrating the pixel of FIG. 1.

Referring to FIG. 1, the display device 10 (or a display panel) may be a device displaying an image (for example, a video and/or a still image), and may be used as a display screen of various products, such as, not only a portable electronic device, such as a mobile phone, a smart phone, a tablet personal computer (PC), a smart watch, a watch phone, a mobile communication terminal, an electronic notebook, an electronic book, a portable multimedia player (PMP), a navigation device, and an ultra mobile PC (UMPC), but also a television, a notebook computer, a monitor, a billboard, and Internet of things (IOT).

The display device 10 may be formed in a plane of a rectangular shape having a long side of a first direction DR1, and a short side of a second direction DR2 crossing the first direction DR1. A corner where the long side of the first direction DR1 and the short side of the second direction DR2 meet may be formed at a right angle, or may be rounded to have a curvature. A planar shape of the display device 10 is not limited to a quadrangle, and may be formed in another polygon, circle, or ellipse. The display device 10 may be formed to be flat, but is not limited thereto. For example, the display device 10 may include a curved portion formed at left and right ends and having a constant curvature or a varying curvature. In addition, the display device 10 may be flexibly formed to be crooked, curved, bent, folded, or rolled.

The display device 10 may include the pixels PX, and signal lines electrically connected to the pixels PX, to display the image. The pixels PX may be arranged in a matrix form in the first direction DR1 and the second direction DR2. For example, the signal lines may include scan lines extending in the first direction DR1 and/or data lines extending in the second direction DR2.

Referring to FIG. 2, the source driving circuit SIC for providing a data signal (or a data voltage) to the pixels PX through data lines may be located on the rear surface or the lower surface of the display device 10. For example, the source driving circuit SIC may be mounted on a flexible film FPCB, and may be combined to the rear surface or the lower surface of the display panel (for example, the panel on which the pixels PX and the data lines are formed) through the flexible film FPCB.

Each of the pixels PX may include sub-pixels SPX1, SPX2, and SPX3 as shown in FIGS. 3 and 4. FIGS. 3 and 4 illustrate that each of the pixels PX includes three sub-pixels SPX1, SPX2, and SPX3, for example, a first sub-pixel SPX1, a second sub-pixel SPX2, and a third sub-pixel SPX3, but the disclosure is not limited thereto.

Each of the first sub-pixel SPX1, the second sub-pixel SPX2, and the third sub-pixel SPX3 may be connected to any one of the data lines and to at least one of the scan lines.

Each of the first sub-pixel SPX1, the second sub-pixel SPX2, and the third sub-pixel SPX3 may have a planar shape of a rectangle, a square, or a rhombus. For example, each of the first sub-pixel SPX1, the second sub-pixel SPX2, and the third sub-pixel SPX3 may have a planar shape of a rectangle having a short side in the first direction DR1, and a long side in the second direction DR2, as shown in FIG. 3. Alternatively, each of the first sub-pixel SPX1, the second sub-pixel SPX2, and the third sub-pixel SPX3 may have a planar shape of a square or a rhombus including sides having the same length in the first direction DR1 and the second direction DR2, as shown in FIG. 4.

As shown in FIG. 3, the first sub-pixel SPX1, the second sub-pixel SPX2, and the third sub-pixel SPX3 may be arranged in the first direction DR1. Alternatively, any one of the second sub-pixel SPX2 and the third sub-pixel SPX3 may be arranged in the first direction DR1 with the first sub-pixel SPX1, and the other of the second sub-pixel SPX2 and the third sub-pixel SPX3 may be arranged in the second direction DR2 with the first sub-pixel SPX1. For example, as shown in FIG. 4, the first sub-pixel SPX1 and the second sub-pixel SPX2 may be arranged in the first direction DR1, and the first sub-pixel SPX1 and the third sub-pixel SPX3 may be arranged in the second direction DR2.

Alternatively, any one of the first sub-pixel SPX1 and the third sub-pixel SPX3 may be arranged in the first direction DR1 with the second sub-pixel SPX2, and the other of the first sub-pixel SPX1 and the third sub-pixel SPX3 may be arranged in the second direction DR2 with the second sub-pixel SPX2. Alternatively, any one of the first sub-pixel SPX1 and the second sub-pixel SPX2 may be arranged in the first direction DR1 with the third sub-pixel SPX3, and the other of the first sub-pixel SPX1 and the second sub-pixel SPX2 may be arranged with the third sub-pixel SPX3 in the second direction DR2.

The first sub-pixel SPX1 may emit first light, the second sub-pixel SPX2 may emit second light, and the third sub-pixel SPX3 may emit third light. Here, the first light may be light of a red wavelength band, the second light may be light of a green wavelength band, and the third light may be light of a blue wavelength band. The red wavelength band may be a wavelength band of about 600 nm to about 750 nm, the green wavelength band may be a wavelength band of about 480 nm to about 560 nm, and the blue wavelength band may be a wavelength band of about 370 nm to about 460 nm, but the disclosure is not limited thereto.

Each of the first sub-pixel SPX1, the second sub-pixel SPX2, and the third sub-pixel SPX3 may include an inorganic light-emitting element including an inorganic semiconductor as a light-emitting element that emits light. For example, the inorganic light-emitting element may be a flip chip type of micro light-emitting diode (LED), but the disclosure is not limited thereto.

As shown in FIGS. 3 and 4, the area of the first sub-pixel SPX1, the area of the second sub-pixel SPX2, and the area of the third sub-pixel SPX3 may be the same, but the disclosure is not limited thereto. At least one of the area of the first sub-pixel SPX1, the area of the second sub-pixel SPX2, and the area of the third sub-pixel SPX3 may be different from another area. Alternatively, any two of the area of the first sub-pixel SPX1, the area of the second sub-pixel SPX2, and the area of the third sub-pixel SPX3 may be the same and the other one may be different from the two areas. Alternatively, the area of the first sub-pixel SPX1, the area of the second sub-pixel SPX2, and the area of the third sub-pixel SPX3 may be different from each other.

Figure 5:
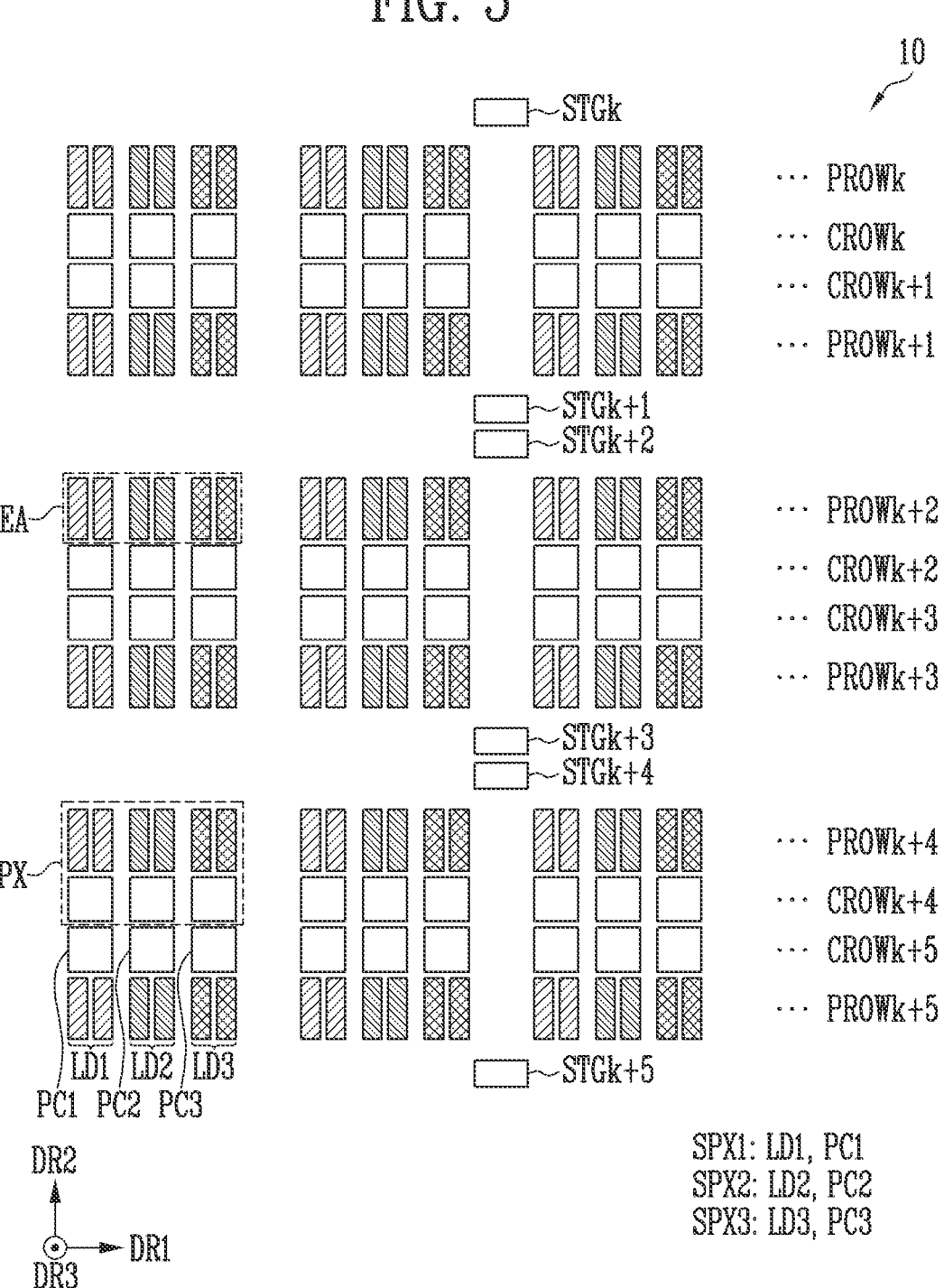
FIG. 5 is a plan view schematically illustrating the display device of FIG. 1.
Figure 6:
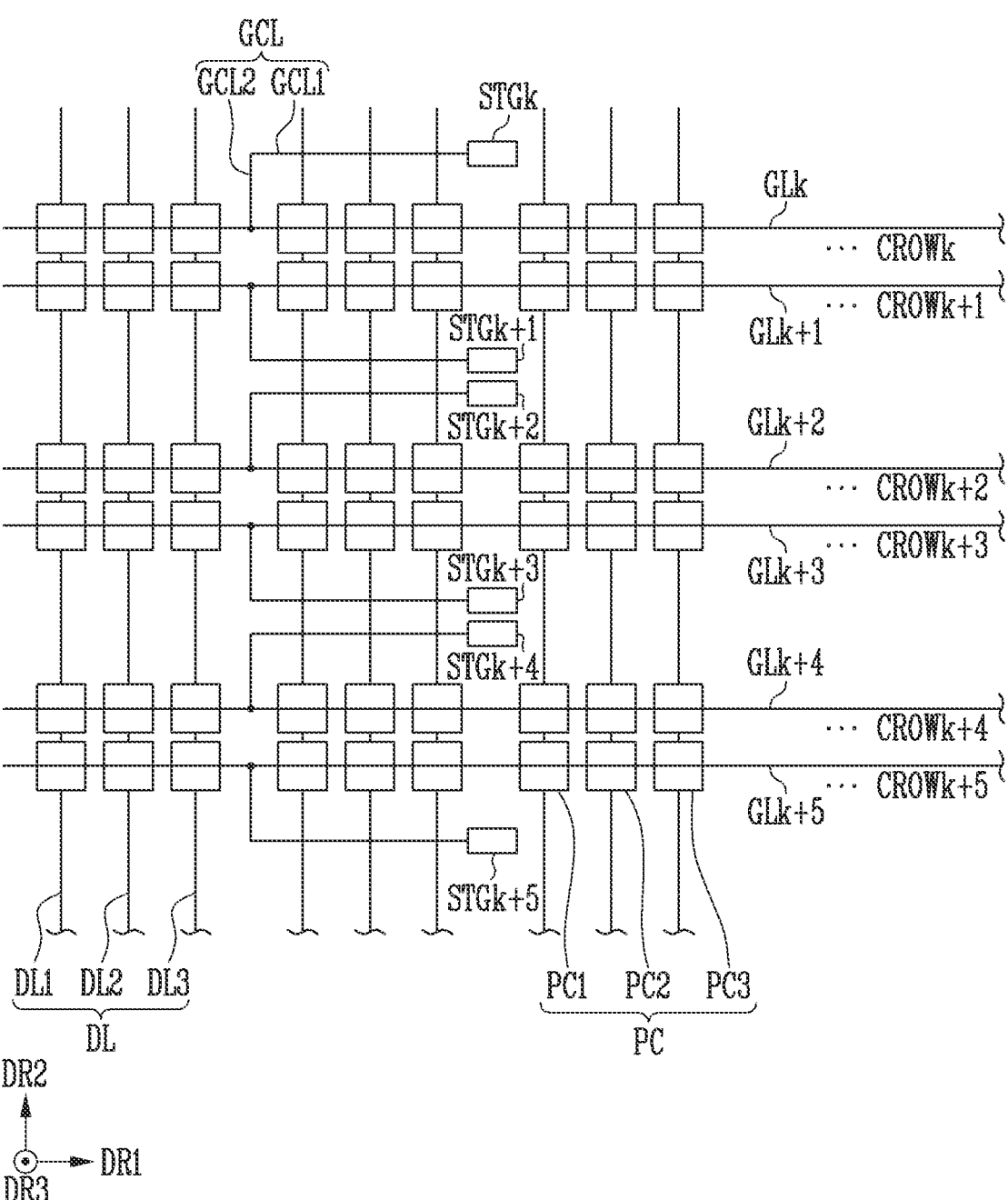
FIG. 6 is a diagram schematically illustrating a connection relationship between a pixel circuit and a stage included in the display device of FIG. 5.

FIG. 5 is a plan view schematically illustrating the display device of FIG. 1. FIG. 6 is a diagram schematically illustrating a connection relationship between a pixel circuit and a stage included in the display device of FIG. 5. Stages may configure at least one gate driver (or scan driver).

Referring to FIGS. 1 to 5, the display device 10 (or the display panel) may include the pixel PX, and the pixel PX may include the first sub-pixel SPX1, the second sub-pixel SPX2, and the third sub-pixel SPX3.

The first sub-pixel SPX1 may include a first light-emitting element LD1 and a first pixel circuit PC1, and the first pixel circuit PC1 may supply a driving current to the first light-emitting element LD1. The first pixel circuit PC1 may be positioned in the second direction DR2 with respect to the first light-emitting element LD1, and the first pixel circuit PC1 may be electrically connected to the first light-emitting element LD1.

The second sub-pixel SPX2 may include a second light-emitting element LD2 and a second pixel circuit PC2, and the second pixel circuit PC2 may supply a driving current to the second light-emitting element LD2. The second pixel circuit PC2 may be positioned in the second direction DR2 with respect to the second light-emitting element LD2, and the second pixel circuit PC2 may be electrically connected to the second light-emitting element LD2.

The third sub-pixel SPX3 may include a third light-emitting element LD3 and a third pixel circuit PC3, and the third pixel circuit PC3 may supply a driving current to the third light-emitting element LD3. The third pixel circuit PC3 may be positioned in the second direction DR2 with respect to the third light-emitting element LD3, and the third pixel circuit PC3 may be electrically connected to the third light-emitting element LD3.

Figure 7:
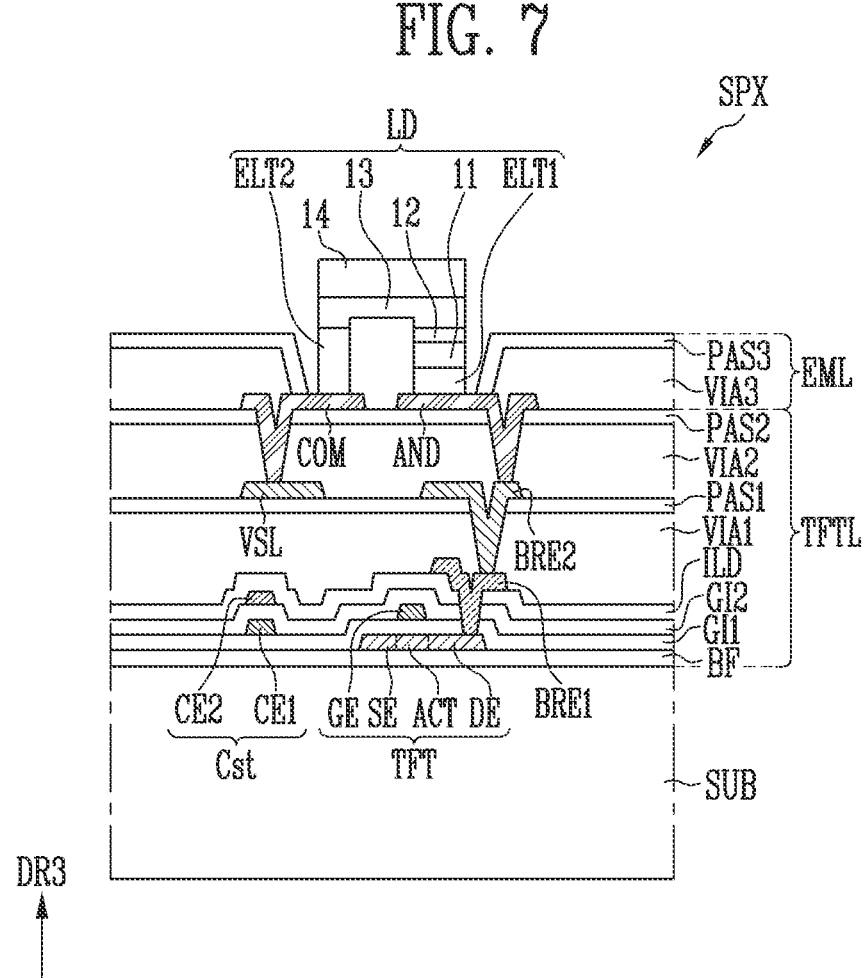
FIG. 7 is a cross-sectional view schematically illustrating a sub-pixel of FIG. 3.

Each of the pixel circuits PC1, PC2, and PC3 may include at least one thin film transistor TFT of FIG. 7 and at least one capacitor Cst of FIG. 7.

According to one or more embodiments, each of the sub-pixels SPX1, SPX2, and SPX3 may include two light-emitting elements. For example, each of the sub-pixels SPX1, SPX2, and SPX3 may include a main light-emitting element and a repair light-emitting element, but is not limited thereto. As another example, each of the sub-pixels SPX1, SPX2, and SPX3 may include three or more light-emitting elements.

Based on the light-emitting elements LD1, LD2, and LD3, the pixels PX may be arranged to have a uniform pixel pitch. The light-emitting elements LD1, LD2, and LD3 may be arranged along pixel rows. For example, the light-emitting elements LD1, LD2, and LD3 may be arranged along k-th to (k+5)-th pixel rows POWk to PROWk+5 (where k is a positive integer). The pixel circuits PC1, PC2, and PC3 may be arranged along circuit rows. The pixel circuits PC1, PC2, and PC3 may be arranged along k-th to (k+5)-th circuit rows CROWk to CROWk+5.

The k-th pixel row PROWk may be adjacent to the k-th circuit row CROWk in the second direction DR2, and the (k+1)-th pixel row PROWk+1 may be adjacent to the (k+1)-th circuit row CROWk+1 in a direction opposite to the second direction DR2. The k-th circuit row CROWk and the (k+1)-th circuit row CROWk+1 may be located between the k-th pixel row PROWk and the (k+1)-th pixel row PROWk+1.

Similarly, the (k+2)-th pixel row PROWk+2 may be adjacent to the (k+2)-th circuit row CROWk+2 in the second direction DR2, and the (k+3)-th pixel row PROWk+3 may be adjacent to the (k+3)-th circuit row CROWk+3 in the direction opposite to the second direction DR2. The (k+2)-th circuit row CROWk+2 and the (k+3)-th circuit row CROWk+3 may be located between the (k+2)-th pixel row PROWk+2 and the (k+3)-th pixel row PROWk+3.

Similarly, the (k+4)-th pixel row PROWk+4 may be adjacent to the (k+4)-th circuit row CROWk+4 in the second direction DR2, and the (k+5)-th pixel row PROWk+5 may be adjacent to the direction opposite to the (k+5)-th circuit row CROWk+5 in the second direction DR2. The (k+4)-th circuit row CROWk+4 and the (k+5)-th circuit row CROWk+5 may be located between the (k+4)-th pixel row PROWk+4 and the (k+5)-th pixel row PROWk+5.

A k-th stage STGk may be located on an upper side of the k-th circuit row CROWk and the k-th pixel row PROWk. The k-th stage STGk may supply a gate signal to a k-th gate line GLk connected to the pixel circuits PC1, PC2, and PC3 of the k-th circuit row CROWk. The k-th stage STGk may be connected to the k-th gate line GLk through a gate connection line GCL. The k-th stage STGk may be connected to the k-th gate line GLk through a first gate connection line GCL1 extending in the first direction DR1 and a second gate connection line GCL2 extending in the second direction DR2.

A (k+1)-th stage STGk+1 and a (k+2)-th stage STGk+2 may be located between the (k+1)-th pixel row POWk+1 and the (k+2)-th pixel row PROWk+2. The (k+1)-th stage STGk+1 may be located on a lower side of the (k+1)-th circuit row CROWk+1 and the (k+1)-th pixel row PROWk+1. The (k+1)-th stage STGk+1 may supply a gate signal to a (k+1)-th gate line GLk+1 connected to the pixel circuits PC of the (k+1)-th circuit row CROWk+1. The (k+1)-th stage STGk+1 may be connected to the (k+1)-th gate line GLk+1 through the gate connection line GCL.

A (k+2)-th stage STGk+2 may be located on an upper side of the (k+2)-th circuit row CROWk+2 and the (k+2)-th pixel row PROWk+2. The (k+2)-th stage STGk+2 may supply a gate signal to a (k+2)-th gate line GLk+2 connected to the pixel circuits PC of the (k+2)-th circuit row CROWk+2. The (k+2)-th stage STGk+2 may be connected to the (k+2)-th gate line GLk+2 through the gate connection line GCL.

A (k+3)-th stage STGk+3 and a (k+4)-th stage STGk+4 may be located between the (k+3)-th pixel row PROWk+3 and the (k+4)-th pixel row PROWk+4. The (k+3)-th stage STGk+3 may be located on a lower side of the (k+3)-th circuit row CROWk+3 and the (k+3)-th pixel row PROWk+3. The (k+3)-th stage STGk+3 may supply a gate signal to a (k+3)-th gate line GLk+3 connected to the pixel circuits PC of the (k+3)-th circuit row CROWk+3. The (k+3)-th stage STGk+3 may be connected to the (k+3)-th gate line GLk+3 through the gate connection line GCL.

The (k+4)-th stage STGk+4 may be located on an upper side of the (k+4)-th circuit row CROWk+4 and the (k+4)-th pixel row PROWk+4. The (k+4)-th stage STGk+4 may supply a gate signal to a (k+4)-th gate line GLk+4 connected to the pixel circuits PC of the (k+4)-th circuit row CROWk+4. The (k+4)-th stage STGk+4 may be connected to the (k+4)-th gate line GLk+4 through the gate connection line GCL.

A (k+5)-th stage STGk+5 may be located on a lower side of the (k+5)-th circuit row CROWk+5 and the (k+5)-th pixel row PROWk+5. The (k+5)-th stage STGk+5 may supply a gate signal to a (k+5)-th gate line GLk+5 connected to the pixel circuits PC of the (k+5)-th circuit row CROWk+5. The (k+5)-th stage STGk+5 may be connected to the (k+5)-th gate line GLk+5 through the gate connection line GCL.

The data line DL may include data lines DL1, DL2, and DL3. A first data line DL1 may supply a data signal to the first pixel circuits PC1 arranged in the same column. A second data line DL2 may supply a data signal to the second pixel circuits PC2 arranged in the same column. A third data line DL3 may supply a data signal to the third pixel circuits PC3 arranged in the same column.

FIG. 7 is a cross-sectional view schematically illustrating a sub-pixel of FIG. 3. Because the sub-pixels SPX1, SPX2, and SPX3 are identical to or similar to each other, the sub-pixels SPX1, SPX2, and SPX3 are collectively referred to as a sub-pixel SPX.

Referring to FIG. 7, a thin film transistor layer TFTL may be located on a substrate SUB. The thin film transistor layer TFTL may be a layer on which a thin film transistors TFT is formed. In one or more embodiments of the disclosure, unless otherwise described, "formed and/or provided on the same layer" may mean formed in the same process, and "formed and/or provided on different layers" may mean formed in different processes.

The substrate SUB may be a base substrate or a base member for supporting the display device 10. The substrate SUB may be a rigid substrate of a glass material. Alternatively, the substrate SUB may be a flexible substrate capable of bending, folding, rolling, or the like. The substrate SUB may include an insulating material of a polymer resin or the like, such as polyimide (PI).

A buffer layer BF may be located on one surface of the substrate SUB. The buffer layer BF may be a layer for reducing or preventing penetration of air or moisture. The buffer layer BF may include a plurality of inorganic layers alternately stacked. For example, the buffer layer BF may be formed as multiple layers in which at least one inorganic layer among silicon nitride (SiNx), silicon oxynitride (SiOxNy), silicon oxide (SiOx), titanium oxide (TiOx), and aluminum oxide (AlOx) is alternately stacked.

According to one or more embodiments, the buffer layer BF may be omitted. An active layer ACT may be located on the buffer layer BF. The active layer ACT may include a silicon semiconductor, such as polycrystalline silicon, single crystal silicon, low-temperature polycrystalline silicon, and amorphous silicon, or may include an oxide semiconductor.

The active layer ACT may include a channel, a source region SE, and a drain region DE of the thin film transistor TFT. The channel of the thin film transistor TFT may be a region overlapping a gate electrode GE of the thin film transistor TFT in a third direction DR3, which is a thickness direction of the substrate SUB. The source region SE of the thin film transistor TFT may be located on one side of the channel, and the drain region DE may be located on another side of the channel. The source region SE and the drain region DE of the thin film transistor TFT may be regions that do not overlap the gate electrode GE in the third direction DR3. The source region SE and the drain region DE of the thin film transistor TFT may be regions having conductivity by doping an ion into a silicon semiconductor or an oxide semiconductor.

A first gate insulating layer G11 may be located on the active layer ACT. The first gate insulating layer G11 may be formed of an inorganic layer, for example, silicon nitride (SiNx), silicon oxynitride (SiOxNy), silicon oxide (SiOx), titanium oxide (TiOx), or aluminum oxide (AlOx).

The gate electrode GE of the thin film transistor TFT and/or a first capacitor electrode CE1 may be located on the first gate insulating layer G11. The gate electrode GE and/or the first capacitor electrode CE1 may be formed as a single layer or multiple layers formed of any one of molybdenum (Mo), aluminum (Al), chromium (Cr), gold (Au), titanium (Ti), nickel (Ni), neodymium (Nd), and copper (Cu), or an alloy thereof.

A second gate insulating layer G12 may be located on the gate electrode GE and/or the first capacitor electrode CE1. The second gate insulating layer G12 may be formed of an inorganic layer, for example, silicon nitride (SiNx), silicon oxynitride (SiOxNy), silicon oxide (SiOx), titanium oxide (TiOx), or aluminum oxide (AlOx).

A second capacitor electrode CE2 may be located on the second gate insulating layer G12. The second capacitor electrode CE2 may configure a capacitor Cst (for example, a storage capacitor for storing a data signal for the sub-pixel SPX or a voltage corresponding the data signal) together with the first capacitor electrode CE1.

The second capacitor electrode CE2 may be formed as a single layer or multiple layers formed of any one of molybdenum (Mo), aluminum (Al), chromium (Cr), gold (Au), titanium (Ti), nickel (Ni), neodymium (Nd), and copper (Cu), or an alloy thereof.

An interlayer insulating layer ILD may be located on the second capacitor electrode CE2. The interlayer insulating layer ILD may be formed of an inorganic layer, for example, silicon nitride (SiNx), silicon oxynitride (SiOxNy), silicon oxide (SiOx), titanium oxide (TiOx), or aluminum oxide (AlOx).

A first bridge electrode BRE1 may be located on the interlayer insulating layer ILD. The first bridge electrode BRE1 may be formed as a single layer or as multiple layers formed of any one of molybdenum (Mo), aluminum (Al), chromium (Cr), gold (Au), titanium (Ti), nickel (Ni), neodymium (Nd), and copper (Cu), or an alloy thereof.

The first bridge electrode BRE1 may be electrically connected to the drain region DE of the thin film transistor TFT through a contact hole passing through the first gate insulating layer G11, the second gate insulating layer G12, and/or the interlayer insulating layer ILD.

A first via layer VIA1 may be formed on the first bridge electrode BRE1. The first via layer VIA1 may be formed of an organic layer, such as acryl resin, epoxy resin, phenolic resin, polyamide resin, or polyimide resin.

A first protective layer PAS1 may be located on the first via layer VIA1. The first protective layer PAS1 may be formed of an inorganic layer, for example, silicon nitride (SiNx), silicon oxynitride (SiOxNy), silicon oxide (SiOx), titanium oxide (TiOx), or aluminum oxide (AlOx).

A second bridge electrode BRE2 and/or a power line VSL may be located on the first protective layer PAS1. The second bridge electrode BRE2 may be electrically connected to the first bridge electrode BRE1 through a contact hole passing through the first protective layer PAS1 and the first via layer VIA1. A power voltage (for example, a low power voltage or a driving power) suitable to drive the sub-pixel SPX may be applied to the power line VSL. The second bridge electrode BRE2 and/or the power line VSL may be formed as a single layer or as multiple layers formed of any one of molybdenum (Mo), aluminum (Al), chromium (Cr), gold (Au), titanium (Ti), nickel (Ni), neodymium (Nd), and copper (Cu), or an alloy thereof.

A second via layer VIA2 may be formed on the second bridge electrode BRE2 and/or the power line VSL. The second via layer VIA2 may be formed of an organic layer, such as acryl resin, epoxy resin, phenolic resin, polyamide resin, or polyimide resin.

A second protective layer PAS2 may be located on the second via layer VIA2. The second protective layer PAS2 may be formed of an inorganic layer, for example, silicon nitride (SiNx), silicon oxynitride (SiOxNy), silicon oxide (SiOx), titanium oxide (TiOx), or aluminum oxide (AlOx).

A light-emitting element layer EML may be located on the second protective layer PAS2. The light-emitting element layer EML may include a pixel electrode AND (or a first pixel electrode), a common electrode COM (or a second pixel electrode), and a light-emitting element LD.

The pixel electrode AND and/or the common electrode COM may be located on the second protective layer PAS2. The pixel electrode AND may be electrically connected to the second bridge electrode BRE2 through a contact hole passing through the second protective layer PAS2 and the second via layer VIA2. The pixel electrode AND may be electrically connected to the thin film transistor TFT through the second bridge electrode BRE2 and the first bridge electrode BRE1. Accordingly, a pixel voltage or an anode voltage controlled by the thin film transistor TFT may be applied to the pixel electrode AND.

The common electrode COM may be electrically connected to the power line VSL through a contact hole passing through the second protective layer PAS2 and the second via layer VIA2. Accordingly, a power voltage of the power line VSL may be applied to the common electrode COM.

The pixel electrode AND and/or the common electrode COM may include a metal material having a high reflectance, such as a stack structure of aluminum and titanium (Ti/Al/Ti), a stack structure of aluminum and ITO (ITO/Al/ITO), an APC alloy, or a stack structure of an APC alloy and ITO (ITO/APC/ITO). The APC alloy is an alloy of silver (Ag), palladium (Pd), and copper (Cu).

A third via layer VIA3 may be located on the second protective layer PAS2. The third via layer VIA3 may cover an edge of the pixel electrode AND and an edge of the common electrode COM, and may include/define an opening at least partially exposing the pixel electrode AND and the common electrode COM. The third via layer VIA3 may be formed of an organic layer, such as acrylic resin, epoxy resin, phenolic resin, polyamide resin, or polyimide resin.

A third protective layer PAS3 may be located on the third via layer VIA3. The third protective layer PAS3 may cover the edge of the pixel electrode AND and the edge of the common electrode COM, and may include/define an opening at least partially exposing the pixel electrode AND and the common electrode COM. The third protective layer PAS3 may be formed of an inorganic layer, for example, silicon nitride (SiNx), silicon oxynitride (SiOxNy), silicon oxide (SiOx), titanium oxide (TiOx), or aluminum oxide (AlOx).

The light-emitting element LD may be located on the pixel electrode AND and the common electrode COM exposed by the third via layer VIA3 and the third protective layer PAS3. FIG. 7 illustrates that the light-emitting element LD is a flip chip type of micro-LED. The light-emitting element LD may be formed of an inorganic material, such as GaN. Each of a length of the first direction DR1, the second direction DR2, and/or the third direction DR3 of the light-emitting element LD may be about several to several hundred μm. For example, each of the length of the first direction DR1, the length of the second direction DR2, and/or the length of the third direction DR3 of the light-emitting element LD may be about 100 μm or less.

The light-emitting element LD may be a light-emitting structure including a first semiconductor layer 11 (or a first semiconductor), an active layer 12 (or an emission layer), a second semiconductor layer 13 (or a second semiconductor), a first contact electrode ELT1 (or a first electrode), and/or a second contact electrode ELT2 (or a second electrode). According to one or more embodiments, the light-emitting element LD may further include a base substrate 14 positioned at the lowermost portion. The base substrate 14 may be a sapphire substrate, but is not limited thereto.

The first semiconductor layer 11 may be located on, or may contact, one surface of the active layer 12. The first semiconductor layer 11 may be formed of GaN doped with a p-type dopant, such as Mg, Zn, Ca, Se, or Ba.

The active layer 12 may be located on one surface of the first semiconductor layer 11. The active layer 12 may include a material of a single or multiple quantum well structure. When the active layer 12 includes the material having the multiple quantum well structure, the active layer 12 may have a structure in which a well layer and a barrier layer are alternately stacked. At this time, the well layer may be formed of InGaN, and the barrier layer may be formed of GaN or AlGaN, but the disclosure is not limited thereto. Alternatively, the active layer 12 may have a structure in which a type of semiconductor material having a large band gap energy and a semiconductor material having a small band gap energy are alternately stacked, and may also include group 3 to group 5 semiconductor materials different according to a wavelength band of emitted light.

When the active layer 12 includes InGaN, a color of emitted light may vary according to a content of indium (In). For example, as the content of indium (In) increases, a wavelength band of light emitted by the active layer 12 may move to a red wavelength band, and as the content of indium (In) decreases, the wavelength band of the light emitted by the active layer 12 may move to a blue wavelength band. For example, a color (or a wavelength band) of light emitted from the light-emitting element LD may be determined according to the content of indium (In) of the active layer 12.

The second semiconductor layer 13 may be located on another surface of the active layer 12, or may be located between the active layer 12 and the base substrate 14. For example, the second semiconductor layer 13 may be formed of GaN doped with an n-type conductive dopant, such as Si, Ge, or Sn.

The first contact electrode ELT1 may be located on one surface of the first semiconductor layer 11, and the second contact electrode ELT2 may be located on one surface of the second semiconductor layer 13.

The first contact electrode ELT1 may be electrically connected to the pixel electrode AND. For example, the first contact electrode ELT1 and the pixel electrode AND may be bonded to each other through a conductive adhesive member, such as an anisotropic conductive film (ACF) or an anisotropic conductive paste (ACP). Alternatively, the first contact electrode ELT1 and the pixel electrode AND may be bonded to each other through a soldering process.

The second contact electrode ELT2 may be electrically connected to the common electrode COM. For example, the second contact electrode ELT2 and the common electrode COM may be bonded to each other through a conductive adhesive member, such as an ACF or an ACP. Alternatively, the second contact electrode ELT2 and the common electrode COM may be bonded to each other through a soldering process.

In one or more embodiments, for the flip chip type, the light-emitting element LD may have a mesa structure. For example, the light-emitting element LD may have a mesa area in which the other is partially exposed by one of the first semiconductor layer 11 and the second semiconductor layer 13. For example, in the light-emitting element LD, the first semiconductor layer 11 may have a shape protruding from one surface of the second semiconductor layer 13, and one surface of the second semiconductor layer 13 may be partially exposed by the first semiconductor layer 11, but the disclosure is not limited thereto.

Figure 8:
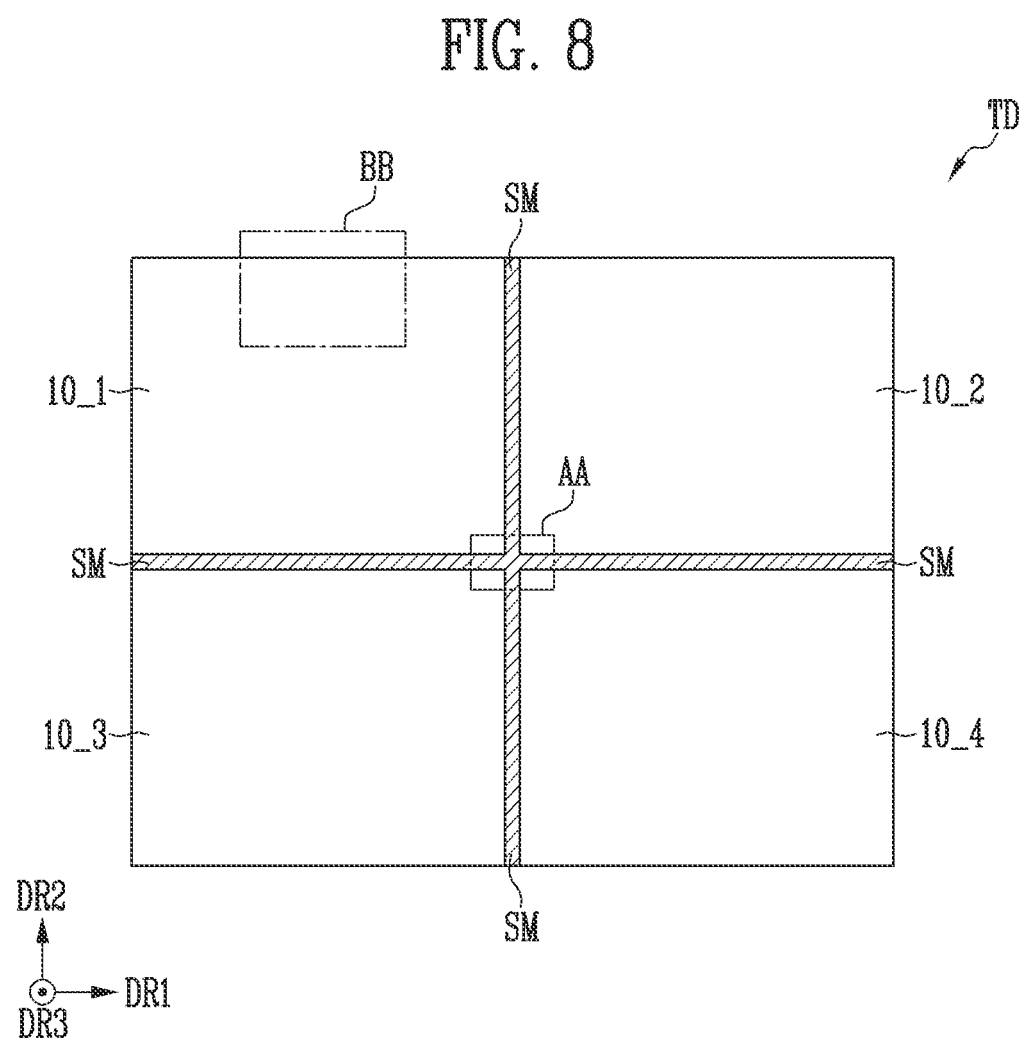

FIG. 8 is a plan view schematically illustrating a tiled display device including a display device according to one or more embodiments.

Referring to FIG. 8, the tiled display device TD may include display devices 10_1, 102, 10_3, and 104, and a seam SM. For example, the tiled display device TD may include a first display device 10_1, a second display device 102, a third display device 103, and a fourth display device 10_4.

The display devices 10_1, 10_2, 103, and 10_4 may be arranged in a grid shape. The display devices 10_1, 10_2, 10_3, and 10_4 may be arranged in a matrix form in M number of rows and N number of columns. Here, each of M and N may be a positive integer. For example, the first display device 10_1 and the second display device 10_2 may be adjacent to each other in the first direction DR1. The first display device 10_1 and the third display device 10_3 may be adjacent to each other in the second direction DR2. The third display device 10_3 and the fourth display device 10_4 may be adjacent to each other in the first direction DR1. The second display device 10_2 and the fourth display device 10_4 may be adjacent to each other in the second direction DR2. However, the disclosure is not limited thereto, and the number and disposition of the display devices 10_1, 10_2, 10_3, and 10_4 in the tiled display device TD may be determined according to a size and a shape of the tiled display device TD.

The respective display devices 10_1, 10_2, 10_3, and 10_4 may have the same size, but are not limited thereto. For example, the respective display devices 10_1, 102, 10_3, and 10_4 may have different sizes.

Each of the display devices 10_1, 10_2, 10_3, and 10_4 may have a rectangular shape including a long side and a short side. The display devices 10_1, 102, 10_3, and 10_4 may be located in a state in which the long sides or the short sides are connected to each other. Some or all of the display devices 10_1, 10_2, 10_3, and 104 may be located at an edge of the tiled display device TD, and may form one side of the tiled display device TD. At least one display device among the display devices 10_1, 10_2, 10_3, and 10_4 may be located at at least one corner of the tiled display device TD, and may form two adjacent sides of the tiled display device TD. At least one display device among the display devices 10_1, 10_2, 10_3, and 10_4 may be surrounded by other display devices.

Because each of the display devices 10_1, 10_2, 10_3, and 10_4 may be the same as, or similar to, the display device 10 described with reference to FIGS. 1 to 7, an overlapping description is omitted.

The seam SM may include a coupling member or an adhesive member. The display devices 10_1, 10_2, 10_3, and 10_4 may be connected to each other through the coupling member or the adhesive member of the seam SM. The seam SM may be located between the first display device 10_1 and the second display device 10_2, between the first display device 10_1 and the third display device 10_3, between the second display device 10_2 and the fourth display device 10_4, and between the third display device 10_3 and the fourth display device 10_4.

Figure 9:
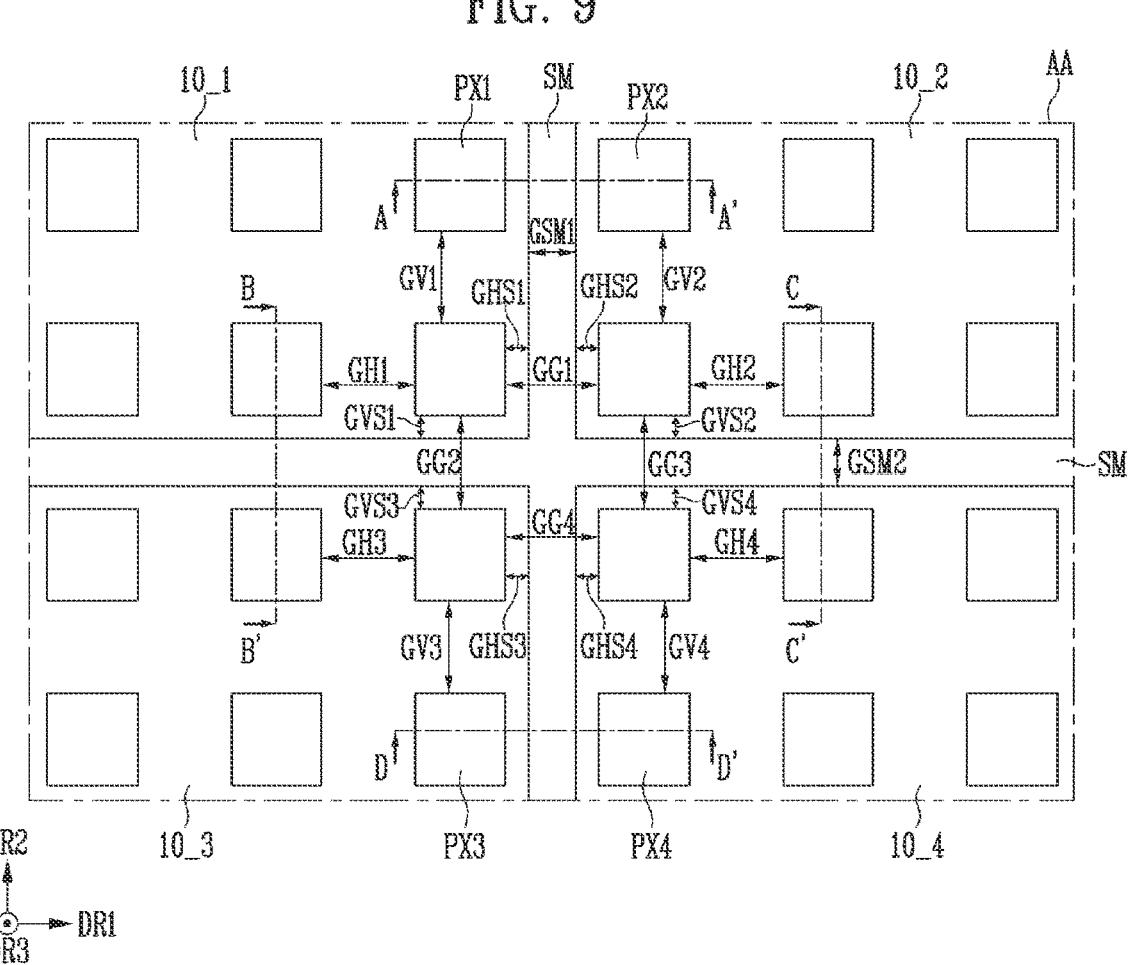
FIG. 9 is a plan view schematically illustrating an area AA of FIG. 8.

FIG. 9 is a plan view schematically illustrating an area AA of FIG. 8.

Referring to FIG. 9, the seam SM may have a planar shape of a crisscross, a cross, or a plus sign in a center area of the tiled display device TD in which the first display device 10_1, the second display device 102, the third display device 10_3, and the fourth display device 10_4 are adjacent to each other. The seam SM may be located between the first display device 10_1 and the second display device 10_2, between the first display device 10_1 and the third display device 10_3, between the second display device 10_2 and the fourth display device 10_4, and between the third display device 10_3 and the fourth display device 10_4.

The first display device 10_1 may include first pixels PX1 arranged in a matrix form in the first direction DR1 and in the second direction DR2 to display an image. The second display device 10_2 may include second pixels PX2 arranged in a matrix form in the first direction DR1 and in the second direction DR2 to display an image. The third display device 10_3 may include third pixels PX3 arranged in a matrix form in the first direction DR1 and in the second direction DR2 to display an image. The fourth display device 10_4 may include fourth pixels PX4 arranged in a matrix form in the first direction DR1 and in the second direction DR2 to display an image. Each of the pixels PX1, PX2, PX3, and PX4 may be the same as or similar to the pixel PX described with reference to FIGS. 3 and 4.

A minimum distance between the first pixels PX1 adjacent in the first direction DR1 may be defined as a first horizontal separation distance GH1, and a minimum distance between the second pixels PX2 adjacent in the first direction DR1 may be defined as a second horizontal separation distance GH2. The first horizontal separation distance GH1 and the second horizontal separation distance GH2 may be the same.

The seam SM may be located between the first pixel PX1 and the second pixel PX2 that are adjacent in the first direction DR1. A minimum distance GG1 between the first pixel PX1 and the second pixel PX2 adjacent in the first direction DR1 may be a sum of a minimum distance GHS1 between the first pixel PX1 and the seam SM in the first direction DR1, a minimum distance GHS2 between the second pixel PX2 and the seam SM in the first direction DR1, and a width GSM1 of the seam SM in the first direction DR1.

The minimum distance GG1 between the first pixel PX1 and the second pixel PX2 adjacent in the first direction DR1, the first horizontal separation distance GH1, and the second horizontal separation distance GH2 may be the same. To this end, the minimum distance GHS1 (for example, a distance from the first pixel PX1 positioned at the outermost portion of the first display device 10_1 to an edge of the first display device 10_1) between the first pixel PX1 and the seam SM in the first direction DR1 may be less than the first horizontal separation distance GH1. The minimum distance GHS2 between the second pixel PX2 and the seam SM in the first direction DR1 may be less than the second horizontal separation distance GH2. The width GSM1 of the seam SM in the first direction DR1 may be less than the first horizontal separation distance GH1 or the second horizontal separation distance GH2.

A minimum distance between the third pixels PX3 adjacent in the first direction DR1 may be defined as a third horizontal separation distance GH3, and a minimum distance between the fourth pixels PX4 adjacent in the first direction DR1 may be defined as a fourth horizontal separation distance GH4. The third horizontal separation distance GH3 and the fourth horizontal separation distance GH4 may be the same.

The seam SM may be located between the third pixel PX3 and the fourth pixel PX4 adjacent in the first direction DR1. A minimum distance GG4 between the third pixel PX3 and the fourth pixel PX4 that are adjacent in the first direction DR1 may be a sum of a minimum distance GHS3 between the third pixel PX3 and the seam SM in the first direction DR1, a minimum distance GHS4 between the fourth pixel PX4 and the seam SM in the first direction DR1, and the width GSM1 of the seam SM in the first direction DR1.

The minimum distance GG4 between the third pixel PX3 and the fourth pixel PX4 adjacent in the first direction DR1, the third horizontal separation distance GH3, and the fourth horizontal separation distance GH4 may be the same. To this end, the minimum distance GHS3 between the third pixel PX3 and the seam SM in the first direction DR1 may be less than the third horizontal separation distance GH3 and the minimum distance GHS4 between the fourth pixel PX4 and the seam SM in the first direction DR1 may be less than the fourth horizontal separation distance GH4. The width GSM1 of the seam SM in the first direction DR1 may be less than the third horizontal separation distance GH3 or the fourth horizontal separation distance GH4.

A minimum distance between the first pixels PX1 adjacent in the second direction DR2 may be defined as a first vertical separation distance GV1, and a minimum distance between the third pixels PX3 in the second direction DR2 may be defined as a third vertical separation distance GV3. The first vertical separation distance GV1 and the third vertical separation distance GV3 may be the same.

The seam SM may be located between the first pixel PX1 and the third pixel PX3 adjacent in the second direction DR2. A minimum distance GG2 between the first pixel PX1 and the third pixel PX3 adjacent in the second direction DR2 may be a sum of a minimum distance GVS1 between the first pixel PX1 and the seam SM in the second direction DR2, a minimum distance GVS3 between the third pixel PX3 and the seam SM in the second direction DR2, and a width GSM2 of the seam SM in the second direction DR2.

The minimum distance GG2 between the first pixel PX1 and the third pixel PX3 adjacent in the second direction DR2, the first vertical separation distance GV1, and the third vertical separation distance GV3 may be the same. To this end, the minimum distance GVS1 between the first pixel PX1 and the seam SM in the second direction DR2 may be less than the first vertical separation distance GV1, and the minimum distance GVS3 between the third pixel PX3 and the seam SM in the second direction DR2 may be less than the third vertical separation distance GV3. The width GSM2 of the seam SM in the second direction DR2 may be less than the first vertical separation distance GV1 or the third vertical separation distance GV3.

A minimum distance between the second pixels PX2 adjacent in the second direction DR2 may be defined as a second vertical separation distance GV2, and a minimum distance between the fourth pixels PX4 adjacent in the second direction DR2 may be defined as a fourth vertical separation distance GV4. The second vertical separation distance GV2 and the fourth vertical separation distance GV4 may be the same.

The seam SM may be located between the second pixel PX2 and the fourth pixel PX4 adjacent in the second direction DR2. A minimum distance GG3 between the second pixel PX2 and the fourth pixel PX4 adjacent in the second direction DR2 may be a sum of a minimum distance GVS2 between the second pixel PX2 and the seam SM in the second direction DR2, a minimum distance GVS4 between the fourth pixel PX4 and the seam SM in the second direction DR2, and the width GSM2 of the seam SM in the second direction DR2.

The minimum distance GG3 between the second pixel PX2 and the fourth pixel PX4 adjacent in the second direction DR2, the second vertical separation distance GV2, and the fourth vertical separation distance GV4 may be substantially the same. To this end, the minimum distance GVS2 between the second pixel PX2 and the seam SM in the second direction DR2 may be less than the second vertical separation distance GV2, and the minimum distance GVS4 between the fourth pixel PX4 and the seam SM in the second direction DR2 may be less than the fourth vertical separation distance GV4. The width GSM2 of the seam SM in the second direction DR2 may be less than the second vertical separation distance GV2 or the fourth vertical separation distance GV4.

As shown in FIG. 9, the minimum distance between the respective pixels of adjacent ones of the display devices may be the same as the minimum distance between the pixels of each of the display devices so that the seam SM is not visually recognized between respective images displayed by the display devices 10_1, 10_2, 10_3, and 10_4.

Figure 10:
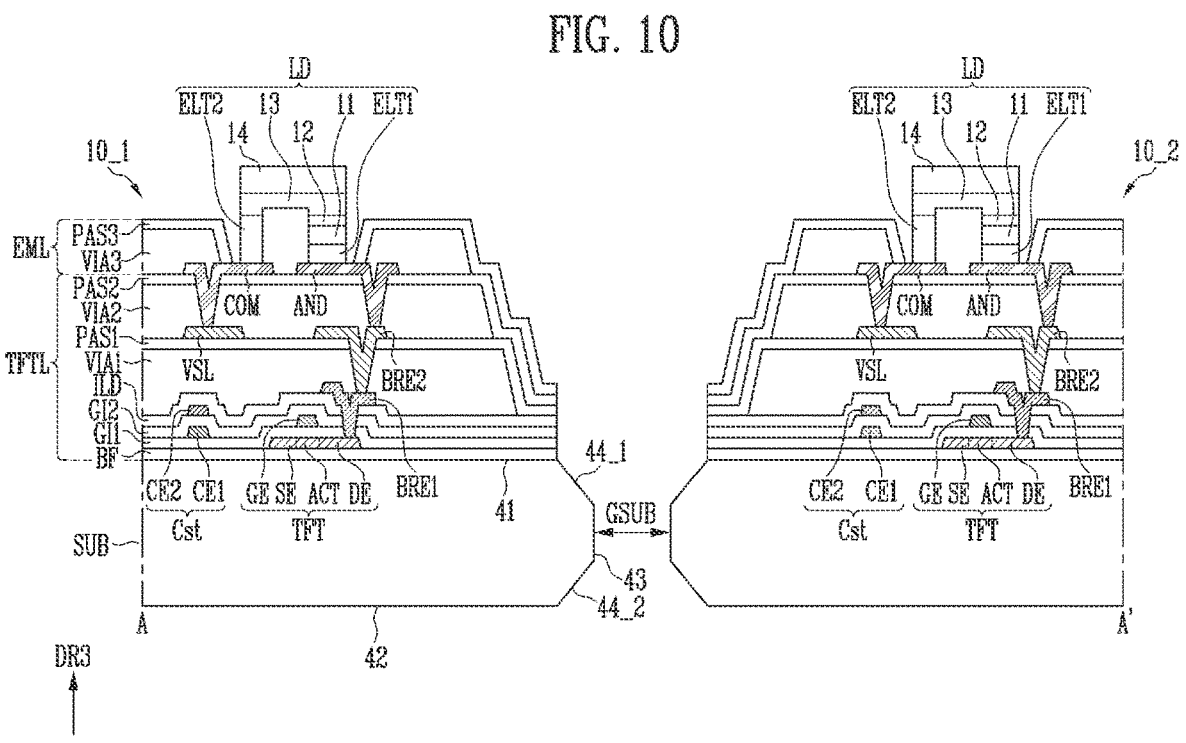
FIG. 10 is a cross-sectional view taken along the line A-A' of FIG. 9.

FIG. 10 is a cross-sectional view taken along the line A-A' of FIG. 9.

Referring to FIG. 10, each of the first display device 10_1 and the second display device 10_2 includes the substrate SUB, the thin film transistor layer TFTL (or a pixel circuit layer), and the light-emitting element layer EML. Because the thin film transistor layer TFTL and the light-emitting element layer EML are described in detail with reference to FIG. 7, an overlapping description is omitted.

The substrate SUB may include a first surface 41 on which the thin film transistor layer TFTL is located, a second surface 42 opposite the first surface 41, and a first side surface 43 located between the first surface 41 and the second surface 42. The first surface 41 may be a front surface or an upper surface of the substrate SUB, and the second surface 42 may be a rear surface or a lower surface of the substrate SUB.

The substrate SUB may further include chamfer surfaces 44_1 and 44_2 located between the first surface 41 and the first side surface 43 and between the second surface 42 and the first side surface 43, respectively. The thin film transistor layer TFTL and the light-emitting element layer EML might not be located on the chamfer surfaces 44_1 and 44_2. The likelihood of the substrate SUB of the first display device 10_1 and the substrate of the second display device 10_2 colliding with each other and being damaged may be reduced or prevented due to the chamfer surfaces 44_1 and 44_2.

The chamfer surfaces 44_1 and 44_2 may also be located between the first surface 41 and each of other side surfaces except for the first side surface 43, and between the second surface 42 and each of other side surfaces except for the first side surface 43, respectively. For example, when the first display device 10_1 and the second display device 10_2 have the planar shape of the rectangle as shown in FIG. 8, the chamfer surfaces 44_1 and 44_2 may be located between the first surface 41 and each of a second side surface, a third side surface, and a fourth side surface, and between the second surface 42 and each of the second side surface, the third side surface, and the fourth side surface, respectively.

According to one or more embodiments, at least one functional layer may be provided in an upper portion of the first display device 10_1 and the second display device 10_2. For example, the functional layer may be attached to the upper portion of the first display device 10_1 and the second display device 10_2 through a transparent adhesive member, such as an optically clear adhesive film or an optically clear resin. For example, the functional layer may include an anti-glare layer and/or a light transmittance control layer. The anti-glare layer may be designed to diffusely reflect external light to reduce or prevent deterioration of image visibility due to reflection of external light as it is. A contrast ratio of an image displayed by the first display device 10_1 and the second display device 10_2 may be increased by the anti-glare layer. The light transmittance control layer may be designed to reduce transmittance of external light or light reflected from the first display device 10_1 and the second display device 10_2. In this case, the likelihood of a distance GSUB between the substrate SUB of the first display device 10_1 and the substrate SUB of the second display device 10_2 being visually recognized from an outside may be reduced or prevented. The anti-glare layer may be implemented as a polarizing plate, and the light transmittance adjusting layer may be implemented as a phase delay layer, but the disclosure is not limited thereto.

Meanwhile, because an example of a tiled display device taken along the line B-B', the line C-C', and the line D-D' of FIG. 9 may be the same as or similar to an example of the tiled display device taken along the line A-A' described with reference to FIG. 10, an overlapping description is omitted.

Figure 17:
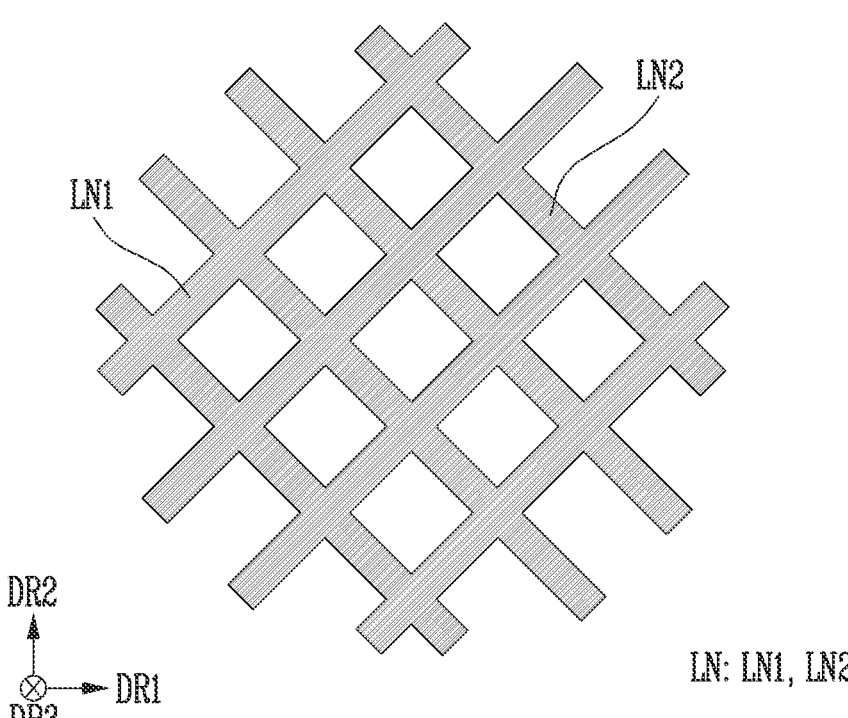
FIGS. 17 and 18 are plan views schematically illustrating a conductive line according to one or more embodiments.
Figure 18:
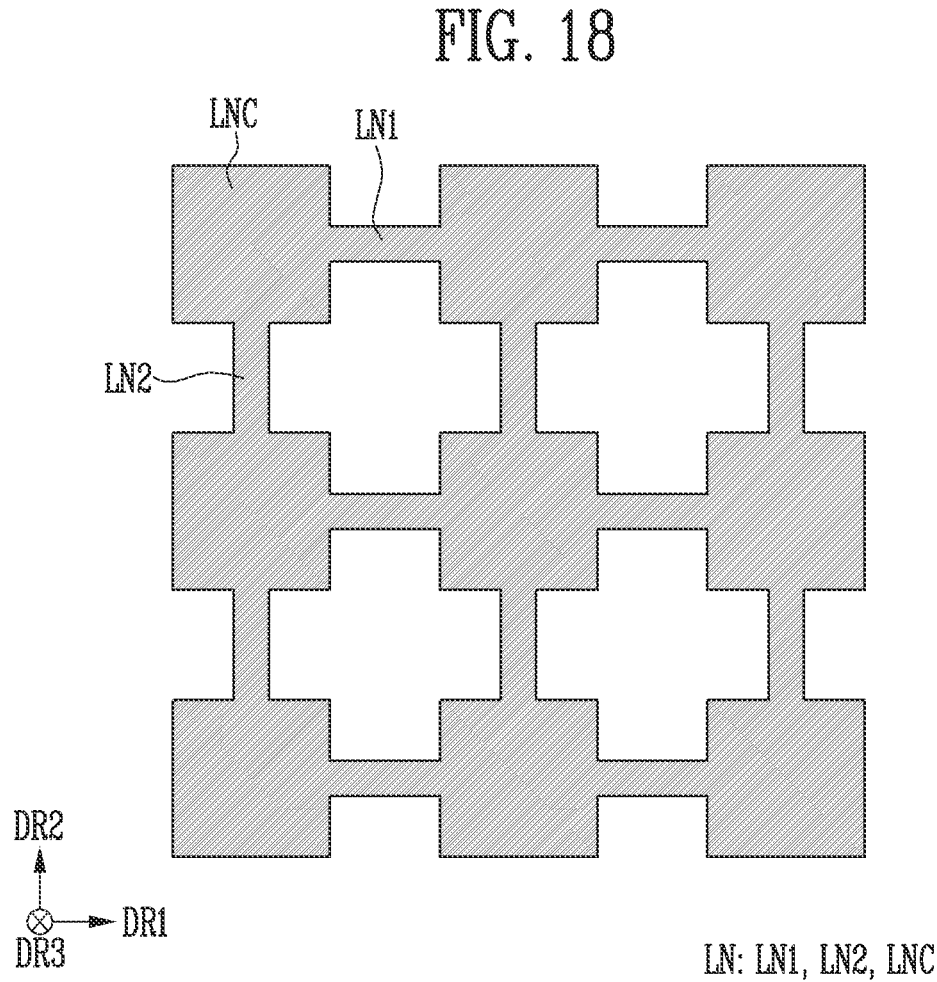
Figure 19:
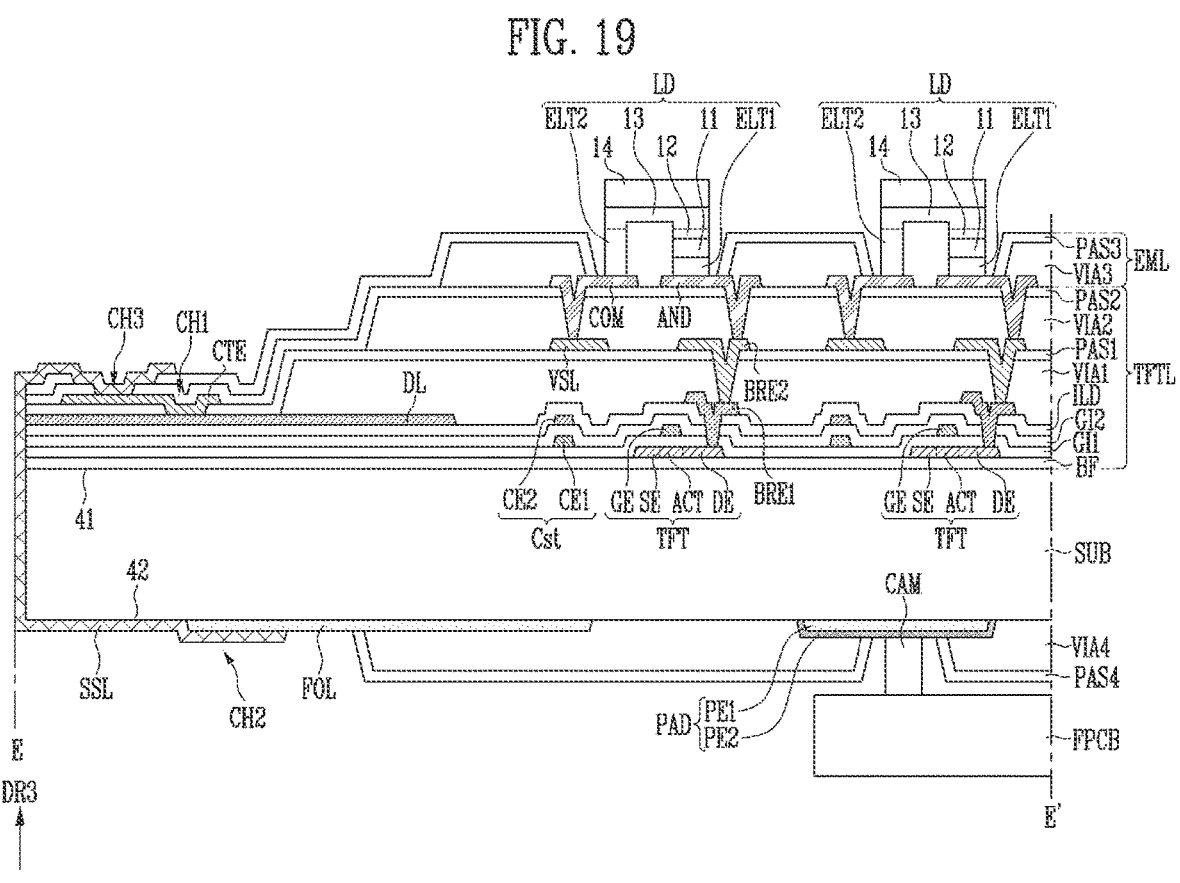
FIG. 19 is a cross-sectional view taken along the line E-E' of FIG. 11.
Figure 20:
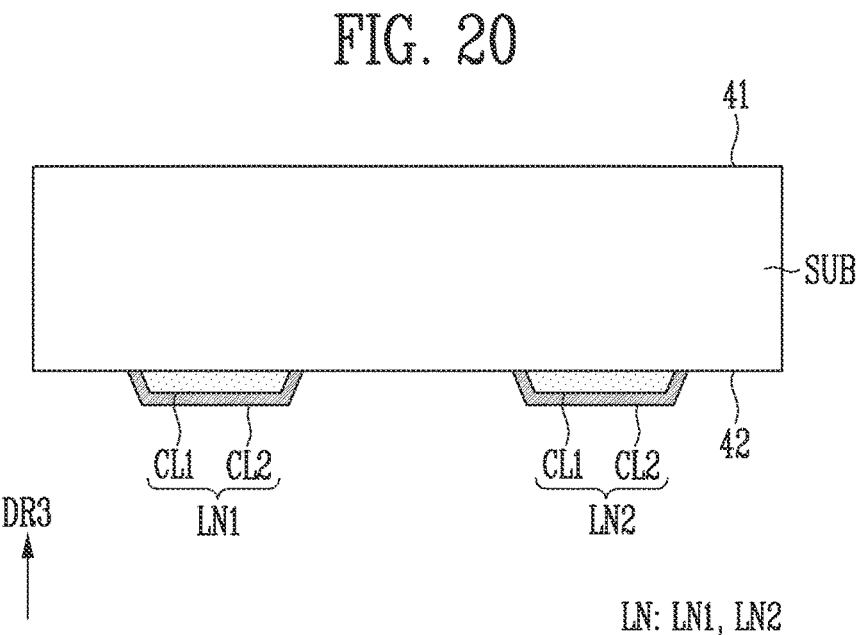
FIGS. 20 and 21 are cross-sectional views schematically illustrating a conductive line of FIG. 12.
Figure 21:
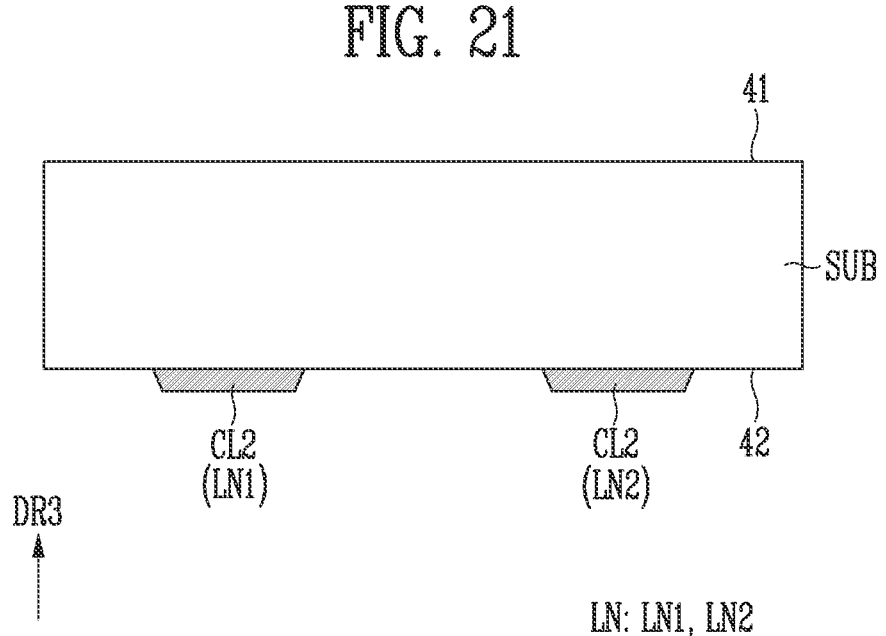

FIGS. 11 to 16 are plan views schematically illustrating an area BB of FIG. 8. FIGS. 17 and 18 are plan views schematically illustrating a conductive line according to one or more embodiments. FIG. 19 is a cross-sectional view taken along the line E-E' of FIG. 11. FIGS. 20 and 21 are cross-sectional views schematically illustrating the conductive line of FIG. 12.

Figure 11:
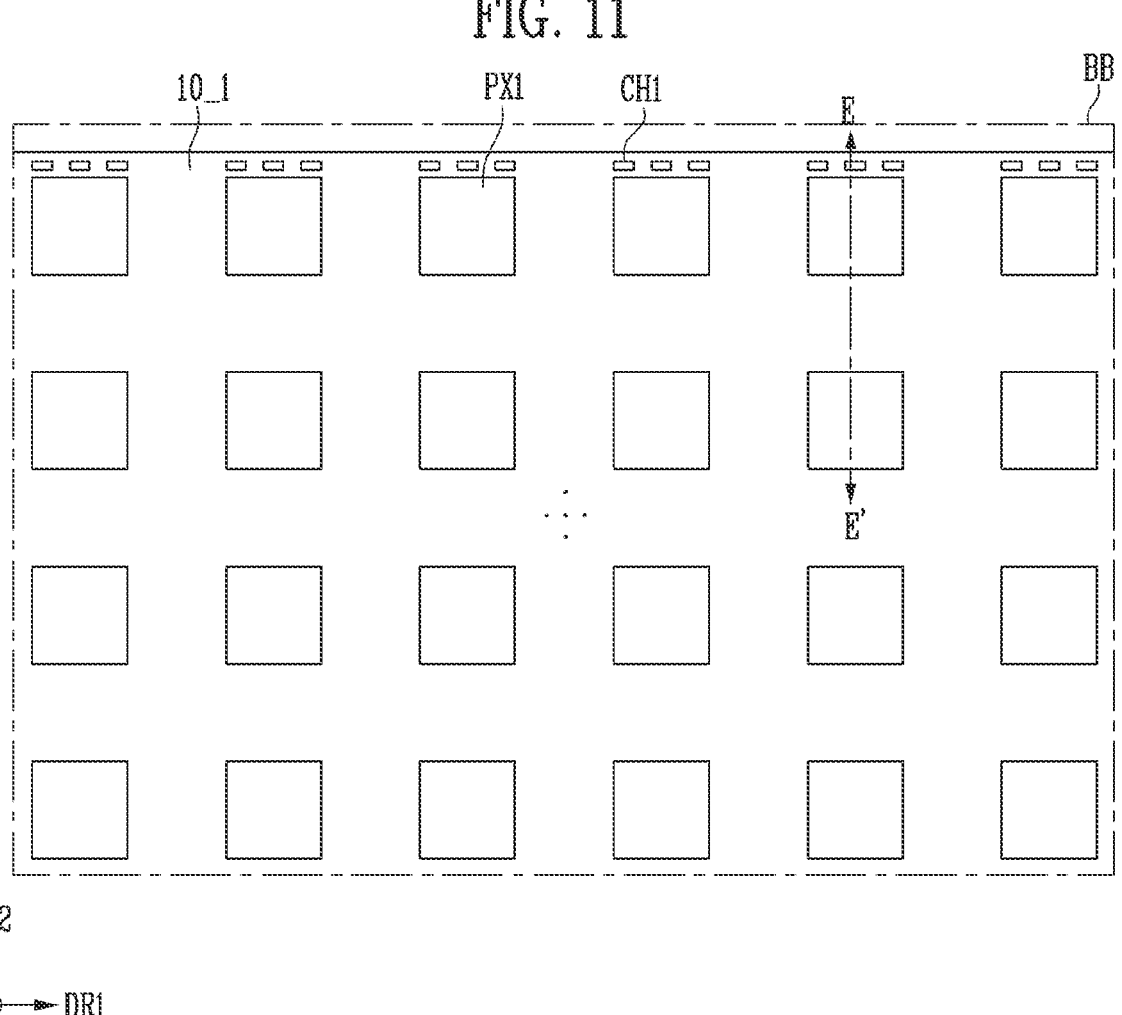
FIGS. 11 to 16 are plan views schematically illustrating an area BB of FIG. 8.
Figure 12:
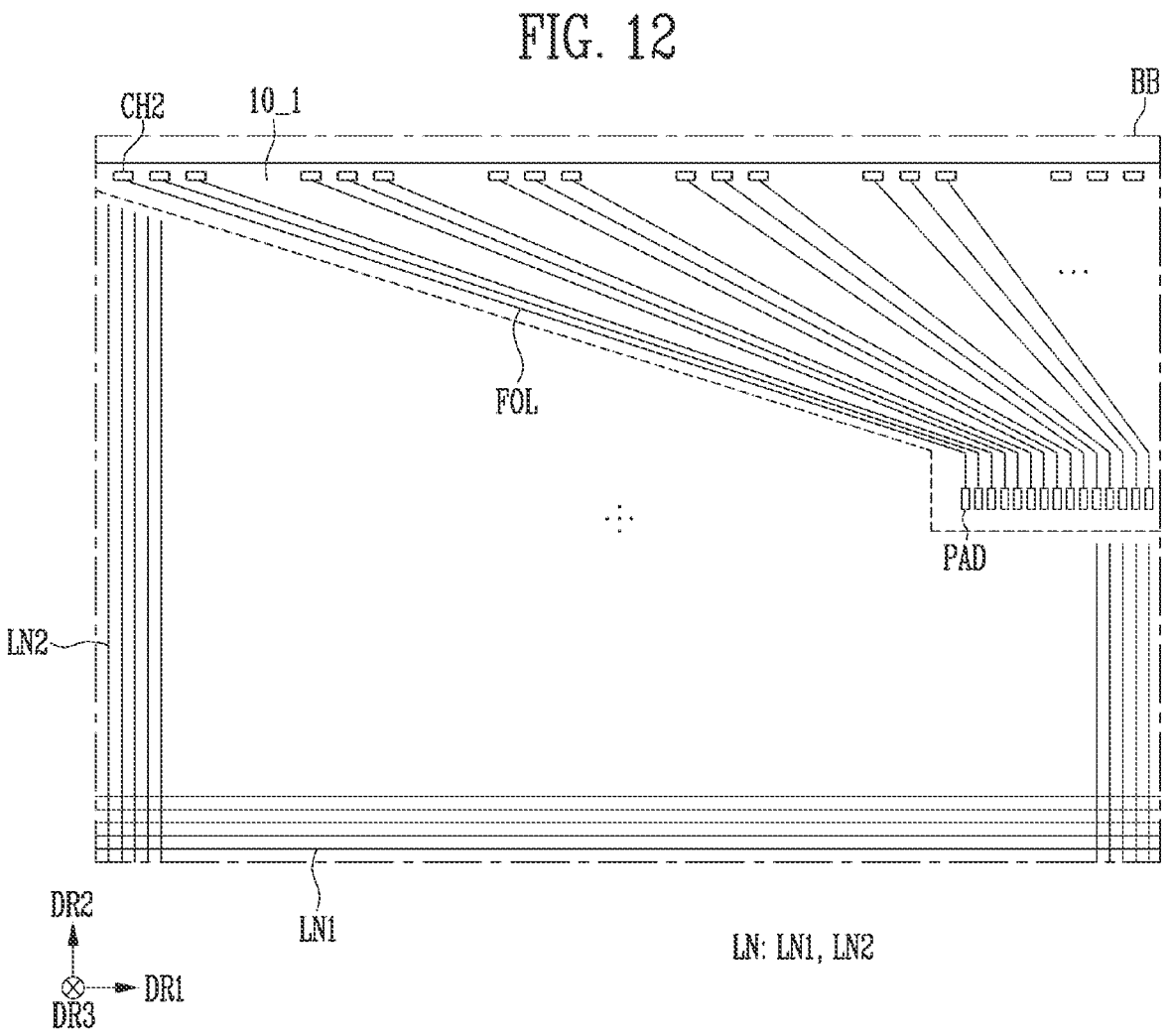
Figure 13:
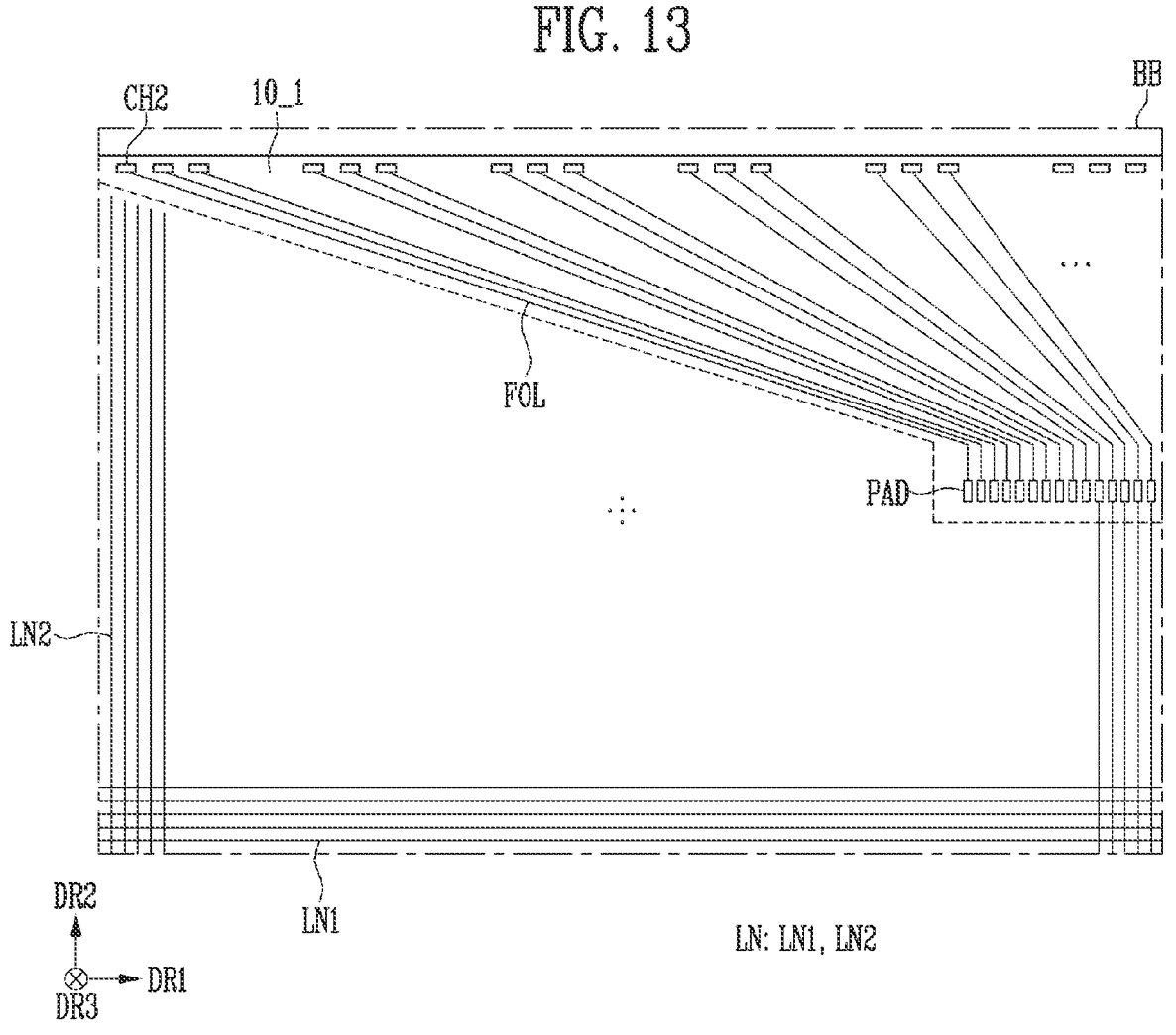
Figure 14:
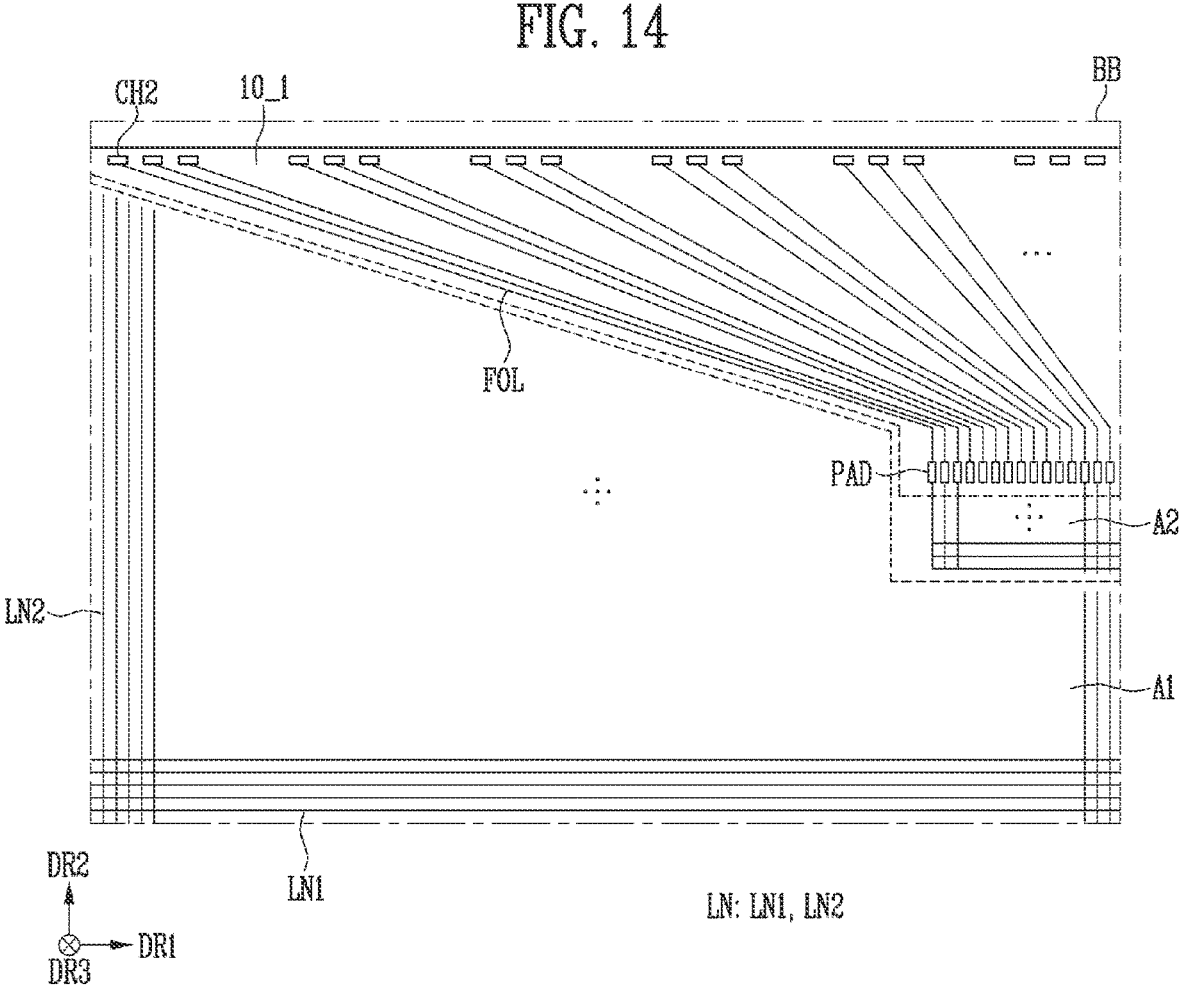

FIG. 11 schematically shows the first display device 10_1 based on a front surface or an upper surface of the first display device 10_1, and FIGS. 12 to 14 schematically show the first display device 10_1 based on a rear surface or a lower surface. Because the second display device 102, the third display device 10_3, and the fourth display device 10_4 have a configuration that is the same as, or similar to, that of the first display device 10_1, an overlapping description is omitted.

Referring to FIGS. 11 to 14, a first contact portion CH1 may be located on an upper edge of the first display device 10_1. However, a position of the first contact portion CH1 is not limited thereto, and the position of the first contact portion CH1 may be freely changed in a range overlapping, or connected to, the signal line.

Referring to FIG. 19, a data line DL may be electrically connected to a connection electrode CTE through the first contact portion CH1. The data line DL may be located on the interlayer insulating layer ILD. The data line DL may be located on the same layer as the above-described first bridge electrode BRE1, but is not limited thereto.

The connection electrode CTE may be located on the first protective layer PAS1. The connection electrode CTE may be located on the same layer as the above-described second bridge electrode BRE2 and/or the power line VSL, but is not limited thereto. The connection electrode CTE may be electrically connected to the data line DL through the first contact portion CH1 passing through the first protective layer PAS1. The second protective layer PAS2 and/or the third protective layer PAS3 may be located on the connection electrode CTE.

A connection line FOL (or a fan-out line), a pad PAD (or a pad electrode), and/or a conductive line LN may be located on the rear surface or the lower surface of the first display device 10_1. The pad PAD may be positioned in one area (for example, a central area) of the first display device 10_1. The connection line FOL may extend from the pad PAD to a second contact portion CH2. The conductive line LN may be located in an area excluding the pad PAD and/or the connection line FOL.

The connection line FOL may be located on the second surface 42 of the substrate SUB. The connection line FOL may be a single layer or multiple layers formed of any one of molybdenum (Mo), aluminum (Al), chromium (Cr), gold (Au), titanium (Ti), nickel (Ni), neodymium (Nd), and copper (Cu), or an ally thereof.

A fourth via layer VIA4 may be located on (e.g., below) the connection line FOL and the second surface 42 of the substrate SUB. The fourth via layer VIA4 may at least partially expose the connection line FOL. The fourth via layer VIA4 may be formed of an organic layer, such as acrylic resin, epoxy resin, phenolic resin, polyamide resin, or polyimide resin. A fourth protective layer PAS4 may be located on (e.g., below) the fourth via layer VIA4. The fourth protective layer PAS4 may at least partially expose the connection line FOL. The fourth protective layer PAS4 may be formed of an inorganic layer, for example, silicon nitride (SiNx), silicon oxynitride (SiOxNy), silicon oxide (SiOx), titanium oxide (TiOx), or aluminum oxide (AlOx).

The connection line FOL may be electrically connected to the first surface 41 of the substrate SUB, for example, via signal lines located on the front or the upper surface of the substrate SUB through the second contact portion CH2. For example, the connection line FOL may be electrically connected to a side surface line SSL through the second contact portion CH2 exposed by the fourth via layer VIA4 and the fourth protective layer PAS4. The side surface line SSL may extend from the second surface 42 to the first surface 41 of the substrate SUB. One end of the side surface line SSL may be electrically connected to the connection line FOL through the second contact portion CH2 on the second surface 42 of the substrate SUB. Another end of the side surface line SSL may be electrically connected to the connection electrode CTE through a third contact portion CH3 exposed by the second protective layer PAS2 and/or the third protective layer PAS3 on the first surface 41 of the substrate SUB. Accordingly, the signal lines located on the first surface 41 of the substrate SUB, for example, the front surface or the upper surface of the substrate SUB, may be electrically connected to the pad PAD through the connection line FOL and/or the side surface line SSL.

The pad PAD may be located on the second surface 42 of the substrate SUB. The pad PAD may include a first pad electrode layer PE1 and a second pad electrode layer PE2. The first pad electrode layer PE1 may be located between the substrate SUB and the second pad electrode layer PE2. The second pad electrode layer PE2 may be located directly on (e.g., directly below) the first pad electrode layer PE1. The second pad electrode layer PE2 may cover the first pad electrode layer PE1. For example, the first pad electrode layer PE1 may be covered by the second pad electrode layer PE2, and may not be exposed to the outside.

The first pad electrode layer PE1 may be a single layer or multiple layers formed of any one of molybdenum (Mo), aluminum (Al), chromium (Cr), gold (Au), titanium (Ti), nickel (Ni), neodymium (Nd), and copper (Cu), or an alloy thereof. The first pad electrode layer PE1 may be located on the same layer as the above-described connection line FOL. The first pad electrode layer PE1 and the connection line FOL may be substantially simultaneously formed in the same process, but are not limited thereto. The second pad electrode layer PE2 may include a transparent conductive material (TCO), such as ITO or IZO.

The flexible film FPCB may be positioned on the second surface 42 of the substrate SUB. The flexible film FPCB may be electrically connected to the pad PAD exposed by the fourth via layer VIA4 and/or the fourth protective layer PAS4 using a conductive adhesive member CAM. The conductive adhesive member CAM may be an anisotropic conductive film or an anisotropic conductive paste, but is not limited thereto. The source driving circuit SIC of FIG. 2 for supplying the data voltages to the data line DL may be located on a lower surface of the flexible film FPCB. The source driving circuit SIC of the flexible film FPCB located on the second surface 42 of the substrate SUB, for example, the rear surface or the lower surface of the substrate SUB may be connected to the data line DL through the pad PAD, the connection line FOL, and/or the side surface line SSL. For example, because the source driving circuit SIC may be located on the substrate SUB to reduce or eliminate a non-display area NDA, the pixels PX may also be formed at an edge of the substrate SUB.

The conductive lines LN may be located on the rear surface of the first display device 10_1 and may be separated from the connection line FOL and/or the pad PAD. For example, as shown in FIG. 12, the conductive lines LN may be entirely located in an area (e.g., a dummy area) excluding the connection line FOL and the pad PAD. For example, the conductive lines LN may be formed on the rear surface of the first display device 10_1 in a mesh shape, but the disclosure is not limited thereto. When the conductive lines LN of a large area of mesh shape are formed on the rear surface of the first display device 10_1, static electricity flowing into the rear surface of the first display device 10_1 during a side surface process of the tiled display device TD may be diffused and discharged. In addition, even though tensile stress occurs with respect to the front surface of the first display device 10_1, compressive stress may be generated by adding the conductive lines LN to the rear surface of the first display device 10_1, and thus warpage of the first display device 10_1 may be improved/reduced.

Alternatively, as shown in FIG. 13, the conductive line LN may be separated from the connection line FOL while being connected to the pad PAD. For example, the conductive line LN may be in contact with the pad PAD. The conductive line LN and the pad PAD may be integrally formed of the same conductive layer, but the disclosure is not limited thereto. As described above, when the conductive lines LN are connected to the pad PAD, the static electricity flowing into the rear surface of the first display device 101 may be transferred to the pad PAD, the flexible film FPCB, and the like through the conductive lines LN and may be discharged. Therefore, damage due to the static electricity may be reduced or minimized.

Alternatively, as shown in FIG. 14, the conductive lines LN located in a first area A1 may be separated from the connection line FOL and/or the pad PAD, and the conductive lines LN located in a second area A2 may be separated from the connection line FOL while being connected to the pad PAD. For example, the conductive lines LN located in the first area A1 may be entirely located in an area (e.g., a dummy area) excluding the connection line FOL, the pad PAD, and the second area A2. The conductive lines LN located in the second area A2 may be in contact with the pad PAD. As described above, when the conductive lines LN located in at least one area (for example, the second area A2) are connected to the pad PAD, the static electricity flowing into the rear surface of the first display device 101 may be transferred to the pad PAD, the flexible film FPCB, and the like through the conductive lines LN and may be discharged. Therefore, damage due to the static electricity may be reduced or minimized.

Figure 15:
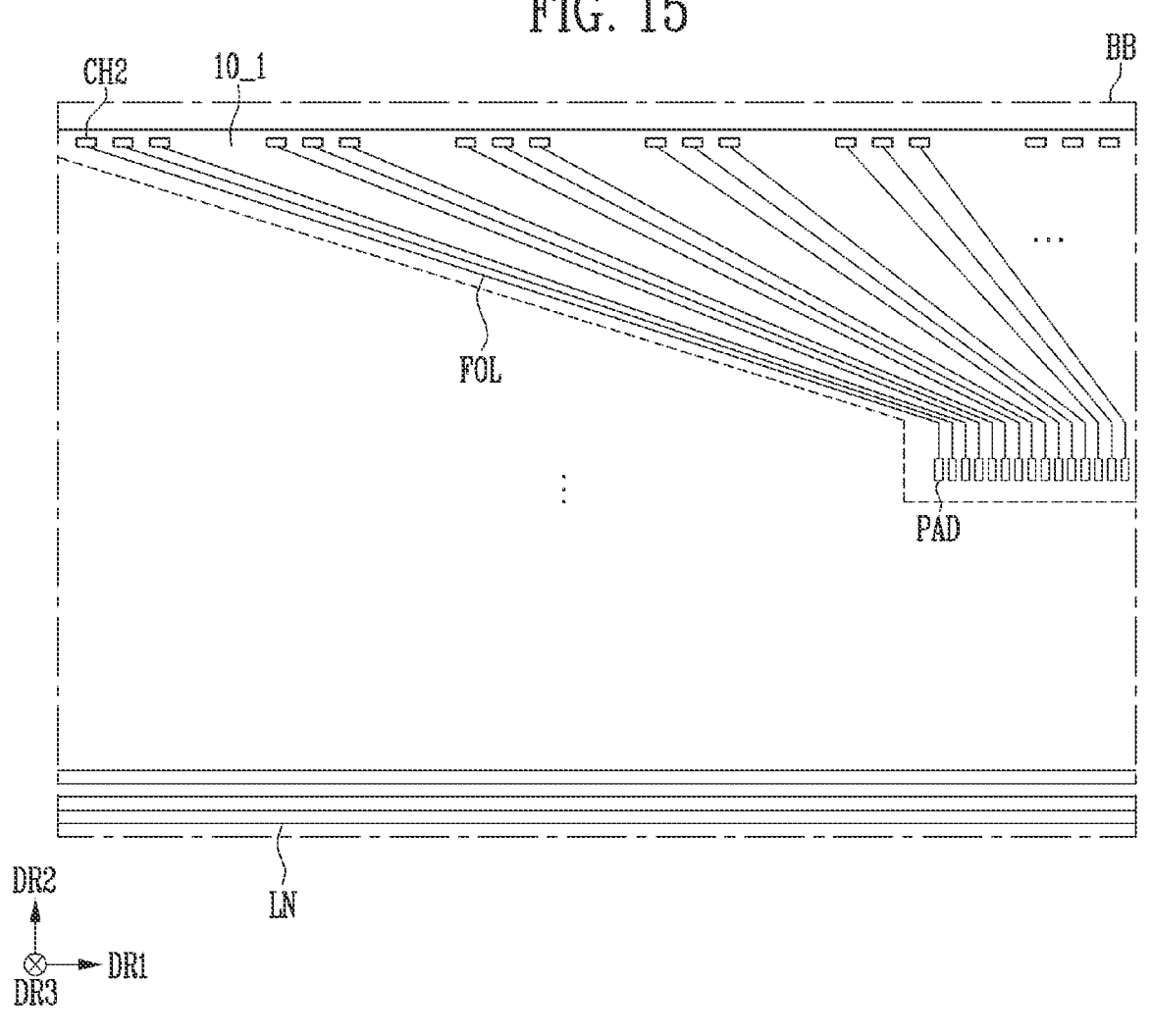

The conductive lines LN may include first conductive lines LN1 and second conductive lines LN2 crossing each other. The first conductive lines LN1 may extend in the first direction DR1, and the second conductive lines LN2 may extend in the second direction DR2. Alternatively, as shown in FIG. 15, the conductive lines LN may extend along the first direction DR1. According to one or more embodiments, the conductive lines LN may be spaced apart from each other in the second direction DR2, and one end of the conductive lines LN may be connected to each other.

Figure 16:
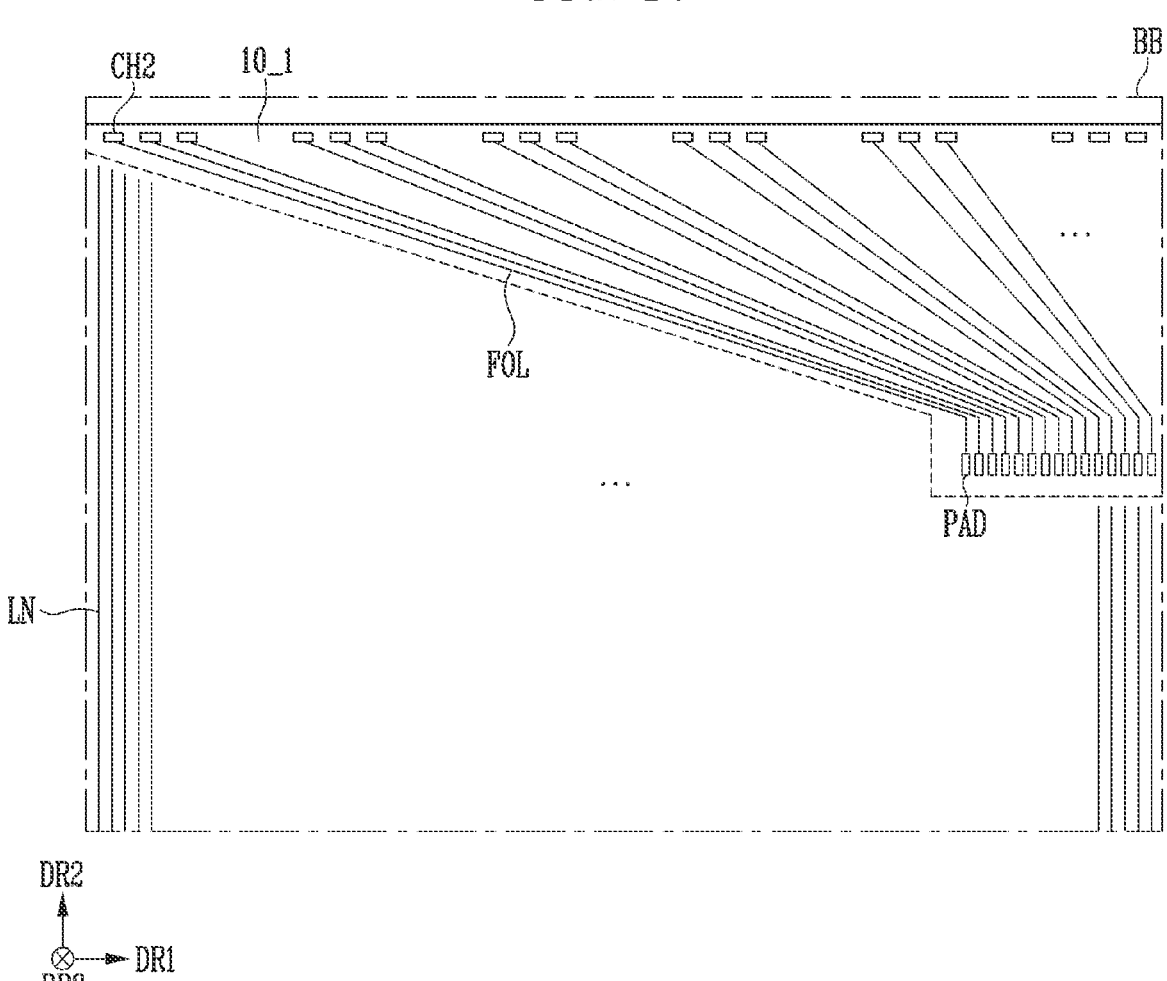

Alternatively, as shown in FIG. 16, the conductive lines LN may extend along the second direction DR2. According to one or more embodiments, the conductive lines LN may be spaced apart from each other in the first direction DR1, and one end of the conductive lines LN may be connected to each other. Alternatively, as shown in FIG. 17, the first conductive lines LN1 extend in a first diagonal direction between the first direction DR1 and the second direction DR2, and the second conductive lines LN2 may extend in a second diagonal direction crossing the first conductive lines LN1. Alternatively, as shown in FIG. 18, a connection portion LNC may be further located at a point where the first conductive lines LN1 and the second conductive lines LN2 cross. A width of the first direction DR1 of the connection portion LNC may be greater than a width of the first direction DR1 of the second conductive line LN2. A width of the second direction DR2 of the connection portion LNC may be greater than a width of the second direction DR2 of the first conductive line LN1. However, an arrangement of the conductive lines LN is not limited thereto, and the conductive lines LN may be formed in various shapes.

The conductive lines LN may be located on the second surface 42 of the substrate SUB. As shown in FIG. 20, the conductive lines LN may include a first conductive layer CL1 and a second conductive layer CL2. The first conductive layer CL1 may be located between the substrate SUB and the second conductive layer CL2. The second conductive layer CL2 may be located directly on (e.g., directly below) the first conductive layer CL1. The second conductive layer CL2 may cover the first conductive layer CL1. For example, the first conductive layer CL1 may be covered by the second conductive layer CL2 and may not be exposed to the outside. Accordingly, corrosion of the first conductive layer CL1 may be reduced or minimized. According to one or more embodiments, as shown in FIG. 21, the first conductive layer CL1 may be omitted, and the second conductive layer CL2 may be located on the second surface 42 of the substrate SUB.

The first conductive layer CL1 may be a single layer or multiple layers formed of any one of molybdenum (Mo), aluminum (Al), chromium (Cr), gold (Au), titanium (Ti), nickel (Ni), neodymium (Nd), copper (Cu), or an alloy thereof. The first conductive layer CL1 may be located on the same layer as the above-described connection line FOL and/or the first pad electrode layer PE1. The first conductive layer CL1, the connection line FOL, and/or the first pad electrode layer PE1 may be substantially simultaneously formed in the same process, but are not limited thereto.

The second conductive layer CL2 may include a TCO, such as ITO or IZO. The second conductive layer CL2 may be located on the same layer as the above-described second pad electrode layer PE2. The second conductive layer CL2 and the second pad electrode layer PE2 may be substantially simultaneously formed in the same process, but are not limited thereto.

As described above, when the conductive lines LN of the large area of mesh shape are formed on the second surface 42 of the substrate SUB, that is, the lower surface or the rear surface of the display device 10, the static electricity may be diffused and discharged through the conductive lines LN even though the static electricity flows into the rear surface of the display device 10 during the side surface process of the tiled display device TD. In addition, when the conductive lines LN are connected to the pad PAD, the static electricity may be transferred to the pad PAD, the flexible film FPCB, and the like through the conductive lines LN, and may be discharged. Accordingly, damage due to the static electricity may be reduced or minimized.

Figure 22:
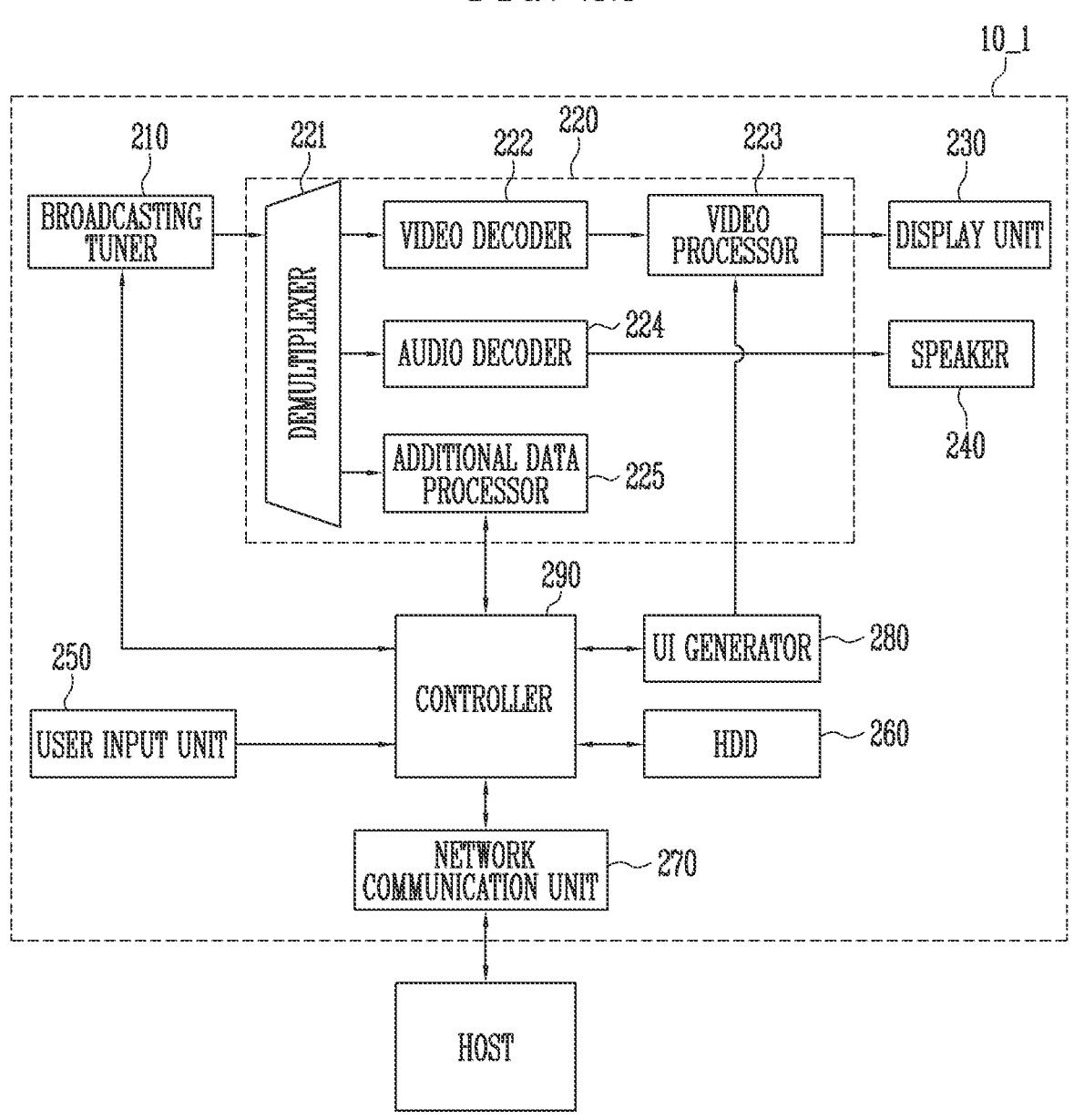
FIG. 22 is a block diagram schematically illustrating a tiled display device according to one or more embodiments.

FIG. 22 is a block diagram schematically illustrating a tiled display device according to one or more embodiments. In FIG. 22, the first display device 10_1 and a host system HOST are shown for convenience of description.

Referring to FIG. 22, the tiled display device TD may include a host system HOST, a broadcast tuner (e.g., a broadcast tuning unit) 210, a signal processor (e.g., a signal processing unit) 220, a display (e.g., a display unit) 230, a speaker 240, a user interface (e.g., a user input unit) 250, an HDD 260, a network communicator (e.g., a network communication unit) 270, a UI generator (e.g., a UI generation unit) 280, and a controller (e.g., a control unit) 290.

The host system HOST may be implemented as any one of a television system, a home theater system, a set-top box, a navigation system, a DVD player, a Blu-ray player, a personal computer, a mobile phone system, and a tablet.

A user's instruction may be input to the host system HOST in various formats. For example, an instruction by a user's touch input may be input to the host system HOST. Alternatively, a user's instruction may be input to the host system HOST by a keyboard input or a button input of a remote controller.

The host system HOST may receive original video data corresponding to an externally received original image. The host system HOST may divide the original video data by the number of display devices. For example, the host system HOST may divide the original video data into first video data corresponding to a first image, second video data corresponding to a second image, third video data corresponding to a third image, and fourth video data corresponding to a fourth image, in response to the first display device 10_1, the second display device 102, the third display device 10_3, and the fourth display device 10_4. The host system HOST may transmit the first video data to the first display device 10_1, may transmit the second video data to the second display device 10_2, may transmit the third video data to the third display device 10_3, and may transmit the fourth video data to the fourth display device 10_4.

The first display device 10_1 may display the first image according to the first video data, the second display device 102 may display the second image according to the second video data, the third display device 10_3 may display the third image according to the third video data, and the fourth display device 10_4 may display the fourth image according to the fourth video data. Accordingly, the user may view the original image in which the first to fourth images displayed on the first to fourth display devices 10_1, 10_2, 10_3, and 10_4 are combined.

The first display device 10_1 may include the broadcast tuner 210, the signal processor 220, the display 230, the speaker 240, the user interface 250, the HDD 260, the network communicator 270, the UI generator 280, and the controller 290.

The broadcast tuner 210 may tune a channel frequency under control of the controller 290, and may receive a broadcast signal of a corresponding channel through an antenna. The broadcast tuner 210 may include a channel detection module and an RF demodulation module.

A broadcast signal demodulated by the broadcast tuner 210 may be processed by the signal processor 220, and may be output to the display 230 and the speaker 240. Here, the signal processor 220 may include a demultiplexer 221, a video decoder 222, a video processor (e.g., a video processing unit) 223, an audio decoder 224, and an additional data processor (e.g., data processing unit) 225.

The demultiplexer 221 may divide the demodulated broadcast signal into a video signal, an audio signal, and additional data. The divided video signal, audio signal, and additional data may be restored by the video decoder 222, the audio decoder 224, and the additional data processor 225, respectively. At this time, the video decoder 222, the audio decoder 224, and the additional data processor 225 may restore as a decoding format corresponding to an encoding format when the broadcast signal is transmitted.

A decoded video signal may be converted by the video processor 223 to fit a vertical frequency, resolution, a screen ratio, and the like corresponding to an output standard of the display 230, and a decoded audio signal may be output to the speaker 240.

The display 230 may include a display panel on which an image is displayed, and a panel driver controlling driving of the display panel.

The user interface 250 may receive a signal transmitted from the host system HOST. The user interface 250 may be provided to receive data for selection and input of an instruction related to communication with other display devices by the user as well as data related to selection of a channel transmitted by the host system HOST, and selection and manipulation of a user interface (UI) menu.

The HDD 260 stores various software programs including an OS program, a recorded broadcast program, a moving picture, a photo, and other data, and may be formed of a storage medium, such as a hard disk or a nonvolatile memory.

The network communicator 270 is for short-range communication with the host system HOST and the other display devices, and may be implemented with a communication module including an antenna pattern that may implement mobile communication, data communication, Bluetooth, RF, Ethernet, and the like.

The network communicator 270 may transmit and receive a wireless signal with at least one of a base station, an external terminal, and/or a server on a mobile communication network built according to technical standards or a communication method (for example, global system for mobile communication (GSM), code division multi access (CDMA), code division multi access 2000 (CDMA2000), enhanced voice-data optimized or enhanced voice-data only (EV-DO), wideband CDMA (WCDMA), high speed downlink packet access (HSDPA), high speed uplink packet access (HSUPA), long term evolution (LTE), long term evolution-advanced (LTE-A), 5G, or the like) for mobile communication through an antenna pattern to be described later.

The network communicator 270 may transmit and receive a wireless signal in a communication network according to wireless Internet technologies through the antenna pattern to be described later. The wireless Internet technologies may include, for example, wireless LAN (WLAN), wireless-fidelity (Wi-Fi), wireless fidelity (Wi-Fi) direct, digital living network alliance (DLNA), wireless broadband (WiBro), world interoperability for microwave access (WiMAX), high speed downlink packet access (HSDPA), high speed uplink packet access (HSUPA), long term evolution (LTE), long term evolution-advanced (LTE-A), and the like, and the antenna pattern may transmit and receive data according to at least one wireless Internet technology within a range including an Internet technology that is not listed above.

The UI generator 280 generates a UI menu for communication with the host system HOST and the other display devices, and may be implemented by an algorithm code and an OSD IC. The UI menu for communication with the host system HOST and the other display devices DV2 to DV4 may be a menu for designating a counterpart digital TV for communication and selecting a desired function.

The controller 290 is in charge of overall control of the first display device 10_1 and is in charge of communication control of the host system HOST and the second to fourth display devices 10_2, 10_3, and 10_4, and a corresponding algorithm code for control is stored, and the controller 290 may be implemented by a micro controller unit (MCU) in which the stored algorithm code is executed.

The controller 290 controls to transmit a corresponding control instruction and data to the host system HOST and the second to fourth display devices 10_2, 10_3, and 10_4 through the network communicator 270 according to an input and selection of the user interface 250. When a control instruction and data (e.g., a predetermined control instruction and data) are input from the host system HOST and the second to fourth display devices 10_2, 10_3, and 10_4, an operation may be performed according to the corresponding control instruction.

Because a block diagram of the second display device 102, a block diagram of the third display device 10_3, and a block diagram of the fourth display device 10_4 may be the same as or similar to the block diagram of the first display device 10_1 described with reference to FIG. 22, an overlapping description is omitted.

The drawings referred to so far and the detailed description of the disclosure described herein are merely examples of the disclosure, are used for merely describing the disclosure, and are not intended to limit the meaning and the scope of the disclosure described in claims. Therefore, those skilled in the art will understand that various modifications and equivalent other embodiments are possible from these. Thus, the true scope of the disclosure should be determined by the technical spirit of the appended claims, with functional equivalents thereof to be included therein.

What is claimed is:

1. A display device comprising:
a signal line above a first surface of a substrate;
a light-emitting element above the signal line, and comprising a first semiconductor layer, a second semiconductor layer, and an active layer between the first semiconductor layer and the second semiconductor layer;
a connection line below a second surface of the substrate, and electrically connected to the signal line; and
conductive lines having a mesh shape below the second surface of the substrate, separated from the connection line, and comprising a first conductive layer, and a second conductive layer covering the first conductive layer.

2. The display device according to claim 1, wherein the conductive lines comprise:
a first conductive line extending in a first direction; and
a second conductive line extending in a second direction crossing the first direction.

3. The display device according to claim 1, wherein the second conductive layer directly contacts the first conductive layer.

4. The display device according to claim 1, wherein the second conductive layer comprises a transparent metal material.

5. The display device according to claim 1, wherein the light-emitting element further comprises:
a first electrode below the first semiconductor layer; and
a second electrode below the second semiconductor layer.

6. The display device according to claim 1, wherein the light-emitting element comprises a flip chip type micro light-emitting diode element.

7. The display device according to claim 1, further comprising a pad electrode electrically connected to the connection line.

8. The display device according to claim 7, wherein the pad electrode comprises:
a first pad electrode layer; and
a second pad electrode layer below the first pad electrode layer.

9. The display device according to claim 8, wherein the second conductive layer is at a same layer as the second pad electrode layer.

10. The display device according to claim 1, wherein the first conductive layer is at a same layer as the connection line.

11. The display device according to claim 1, further comprising a side surface line on a side surface of the substrate between the first surface and the second surface of the substrate, and electrically connecting the signal line and the connection line.

12. A tiled display device comprising:
display devices; and a seam between the display devices,
wherein a first display device among the display devices comprises:
a signal line above a first surface of a substrate;
a light-emitting element above the signal line, and comprising a first semiconductor layer, a second semiconductor layer, and an active layer between the first semiconductor layer and the second semiconductor layer;
a connection line below a second surface of the substrate, and electrically connected to the signal line; and conductive lines having a mesh shape below the second surface of the substrate, separated from the connection line, and crossing each other.

13. The tiled display device according to claim 12, wherein the first display device further comprises a pad electrode below the second surface of the substrate, and electrically connected to the connection line.

14. The tiled display device according to claim 13, wherein the pad electrode comprises:

a first pad electrode layer; and a second pad electrode layer below the first pad electrode layer.

15. The tiled display device according to claim 14, wherein the conductive lines comprise a first conductive layer at a same layer as the first pad electrode layer.

16. The tiled display device according to claim 15, wherein the conductive lines further comprise a second conductive layer covering the first conductive layer, and at a same layer as the second pad electrode layer.

17. The tiled display device according to claim 13, wherein the conductive lines contact the pad electrode.

18. The tiled display device according to claim 12, wherein the first display device further comprises a side surface line on a side surface of the substrate between the first surface and the second surface of the substrate, and electrically connecting the signal line and the connection line.

19. The tiled display device according to claim 12, wherein the light-emitting element comprises a flip chip type micro light-emitting diode element.

20. The tiled display device according to claim 12, wherein the display devices are arranged in a matrix form of M rows and N columns.

* * * * *